(12) United States Patent
Sasuga et al.

(10) Patent No.: US 7,359,024 B2
(45) Date of Patent: Apr. 15, 2008

(54) STRUCTURE OF LIQUID CRYSTAL DISPLAY DEVICE FOR EASY ASSEMBLY AND DISASSEMBLY

(75) Inventors: Masumi Sasuga, Mobara (JP); Junichi Ohwada, Mobara (JP); Akira Kobayashi, Mobara (JP); Masaru Fujita, Mobara (JP); Hiroshi Nakamoto, Mobara (JP); Ryu Ono, Chiba (JP); Tsutomu Isono, Ohtaki-machi (JP)

(73) Assignees: Hitachi, Ltd., Tokyo (JP); Hitachi Device Engineering Co., Ltd., Hayano, Mobara-Shi (JP)

( * ) Notice: Subject to any disclaimer, the term of this patent is extended or adjusted under 35 U.S.C. 154(b) by 0 days.

(21) Appl. No.: 11/053,238

(22) Filed: Feb. 9, 2005

(65) Prior Publication Data

US 2005/0157241 A1    Jul. 21, 2005

Related U.S. Application Data

(63) Continuation of application No. 10/218,427, filed on Aug. 15, 2002, now Pat. No. 6,856,362, which is a continuation of application No. 09/761,184, filed on Jan. 18, 2001, now Pat. No. 6,466,282, which is a continuation of application No. 09/184,012, filed on Nov. 2, 1998, now Pat. No. 6,195,148, which is a continuation of application No. 08/884,132, filed on Jun. 27, 1997, now Pat. No. 5,987,188, which is a continuation of application No. 08/460,933, filed on Jun. 5, 1995, now Pat. No. 5,680,183, which is a continuation of application No. 08/197,848, filed on Feb. 15, 1994, now abandoned, which is a continuation of application No. 08/029,622, filed on Mar. 11, 1993, now Pat. No. 5,432,626.

(30) Foreign Application Priority Data

Mar. 12, 1992 (JP) .................... 4-53452

(51) Int. Cl.
*G02F 1/1343* (2006.01)
*G02F 1/1346* (2006.01)

(52) U.S. Cl. ...................... 349/139; 349/43

(58) Field of Classification Search ............. 349/139, 349/110, 156, 42–43; 257/59, 72
See application file for complete search history.

(56) References Cited

U.S. PATENT DOCUMENTS 4,294,517 A     10/1981   Jakubek
(Continued)

FOREIGN PATENT DOCUMENTS

JP    60-143380    7/1985
(Continued)

*Primary Examiner*—Toan Ton
(74) *Attorney, Agent, or Firm*—Antonelli, Terry, Stout & Kraus, LLP.

(57) ABSTRACT

A liquid crystal display device includes first and second substrates with a liquid crystal layer therebetween, and a transparent conductor which is formed at a liquid crystal side of at least one of the first and the second substrates. At least a projected portion is formed on the transparent conductor in a pixel region, and a material of the projected portion is different from a material of the transparent conductor.

10 Claims, 37 Drawing Sheets

U.S. PATENT DOCUMENTS

| | | | |
|---|---|---|---|
| 4,367,467 A | 1/1983 | Emile, Jr. | |
| 4,385,292 A * | 5/1983 | Nonomura et al. | 345/53 |
| 4,474,432 A | 10/1984 | Takamatsu et al. | |
| 4,486,077 A | 12/1984 | Torresdal | |
| 4,755,035 A | 7/1988 | Kopish et al. | |
| 4,759,610 A * | 7/1988 | Yanagisawa | 349/162 |
| 4,772,100 A | 9/1988 | Suenaga | |
| 4,862,153 A | 8/1989 | Nakatani et al. | |
| 4,878,738 A | 11/1989 | Harami | |
| 4,945,350 A | 7/1990 | Kawamura | |
| 5,130,833 A | 7/1992 | Mase | |
| 5,132,821 A * | 7/1992 | Nicholas | 349/43 |
| 5,146,354 A | 9/1992 | Plesinger | |
| 5,151,806 A * | 9/1992 | Kawamoto et al. | 349/39 |
| 5,168,384 A | 12/1992 | Genba | |
| 5,193,022 A | 3/1993 | Hirai | |
| 5,258,866 A | 11/1993 | Ishikawa et al. | |
| 5,311,341 A | 5/1994 | Hirai | |
| 5,327,267 A | 7/1994 | Aoki et al. | |
| 5,341,233 A | 8/1994 | Tomoike et al. | |
| 5,349,205 A * | 9/1994 | Kobayashi et al. | 257/59 |
| 5,375,005 A | 12/1994 | Komano | |
| 5,402,255 A | 3/1995 | Nakanishi et al. | |
| 5,473,450 A * | 12/1995 | Yamada et al. | 349/84 |
| 5,486,942 A | 1/1996 | Ichikawa et al. | |
| 5,668,700 A | 9/1997 | Tagusa et al. | |
| 5,680,183 A | 10/1997 | Sasuga et al. | |
| 5,841,501 A | 11/1998 | Eiraku et al. | |
| 5,963,288 A * | 10/1999 | Sato et al. | 349/154 |

FOREIGN PATENT DOCUMENTS

| | | |
|---|---|---|
| JP | 62-137468 | 8/1987 |
| JP | 63-20126 | 2/1988 |
| JP | 63-54127 | 4/1988 |
| JP | 63-173274 | 11/1988 |
| JP | 63-313127 | 12/1988 |
| JP | 1-219823 | 9/1989 |
| JP | 1-237591 | 9/1989 |
| JP | 2-17776 | 2/1990 |
| JP | 2-119623 | 9/1990 |
| JP | 3-45585 | 4/1991 |
| JP | 4-43327 | 2/1992 |
| JP | 4051595 | 2/1992 |

* cited by examiner $y_i$ →

$y_{i+1}$ →

$y_{i+2}$ →

US 7,359,024 B2

STRUCTURE OF LIQUID CRYSTAL DISPLAY DEVICE FOR EASY ASSEMBLY AND DISASSEMBLY

CROSS REFERENCE TO RELATED APPLICATIONS

This is a continuation of U.S. application Ser. No. 10/218,427, filed Aug. 15, 2002, now U.S. Pat. No. 6,856,362, which is a continuation of U.S. application Ser. No. 09/761,184, filed Jan. 18, 2001, now U.S. Pat. No. 6,466,282, which is a continuation of U.S. application Ser. No. 09/184,012, filed Nov. 2, 1998, now U.S. Pat. No. 6,195,148, which is a continuation application of U.S. application Ser. No. 08/884,132, filed Jun. 27, 1997, now U.S. Pat. No. 5,987,188, which is a continuation of U.S. application Ser. No. 08/460,933, filed Jun. 5, 1995, now U.S. Pat. No. 5,680,183, which is a continuation of U.S. application Ser. No. 08/197,848, filed Feb. 15, 1994, now abandoned, which is a continuation of U.S. application Ser. No. 08/029,622, filed Mar. 11, 1993, now U.S. Pat. No. 5,432,626, the subject matter of which is incorporated by reference herein.

BACKGROUND OF THE INVENTION

1. Field of the Invention

The present invention relates to a liquid crystal display device and, more particularly, to a liquid crystal display device of active matrix type using thin film transistors or the like.

2. Prior Art

In a liquid crystal display device of active matrix type, non-linear device (e.g., switching devices) are disposed in a manner to correspond to a plurality of pixel electrodes arranged in matrix, respectively. The liquid crystal in each pixel is always drive, in principle, (at a duty ratio of 1.0). In comparison with the so-called "simple matrix type" which employs a time division driving system, therefore, the active system has better contrast and has become an indispensable technique particularly in a color liquid crystal display device. A typical example of the switching devices is a thin film transistor (TFT).

A liquid crystal display circuit (or a liquid crystal display panel) is constructed: by superposing a lower substrate, which is formed, over a lower transparent glass substrate with reference to a liquid crystal layer, sequentially with a thin film transistor, a transparent pixel electrode, a passivation film for the thin film transistor, and a lower orientation film for orienting liquid crystal molecules; and an upper substrate, which is formed over an upper transparent glass substrate sequentially with a black matrix, a color filter, a passivation film for the color filter, a common transparent pixel electrode and an upper orientation film, such that their orientation films are opposed to each other; by bonding the two substrates by a sealing material arranged around the edges of the substrates; and by sealing up the liquid crystals between the two substrates. Incidentally, a back light is arranged at the side of the lower substrate.

Here, the liquid crystal display device of active matrix type using the thin film transistors is known in Japanese Patent Laid-Open No. 309921/1988 or on pp. 193 to 210 of Nikkei Electronics entitled "Active Matrix Type Color Liquid Crystal Display of 12.5 Type Adopting Redundant Construction" and issued on Dec. 15, 1986 by NIKKEI McGRAW-HILL, for example.

SUMMARY OF THE INVENTION

Since a shield casing made of a metal plate or a liquid crystal display circuit is fixed by means of rivets, the liquid crystal display device of the prior art is troubled by a difficulty in repair or replacement of the back lights.

An object of the present invention is to provide a liquid crystal display device which can be easily repaired or repaired in its back lights.

According to one embodiment of the present invention, there is provided a liquid crystal display device which comprises: a shield casing made of a metal plate and having fixing pawls and fixing hooks; an middle frame for holding a liquid crystal display; and a lower casing for packaging back lights, wherein the fixing pawls of said shield casing are bent in corresponding recesses formed in the middle frame, and wherein the fixing hooks of said shield casing are fitted on corresponding projections formed on the lower casing.

The liquid crystal display device can be easily repaired and replaced in its back lights because the fixing pawls and hooks of the shield casing can be easily removed and because the shield casing, the middle frame for holding the liquid crystal display and the lower casing for packaging the back lights are easily assembled and disassembled.

DESCRIPTION OF THE PREFERRED EMBODIMENTS

Figure 1:
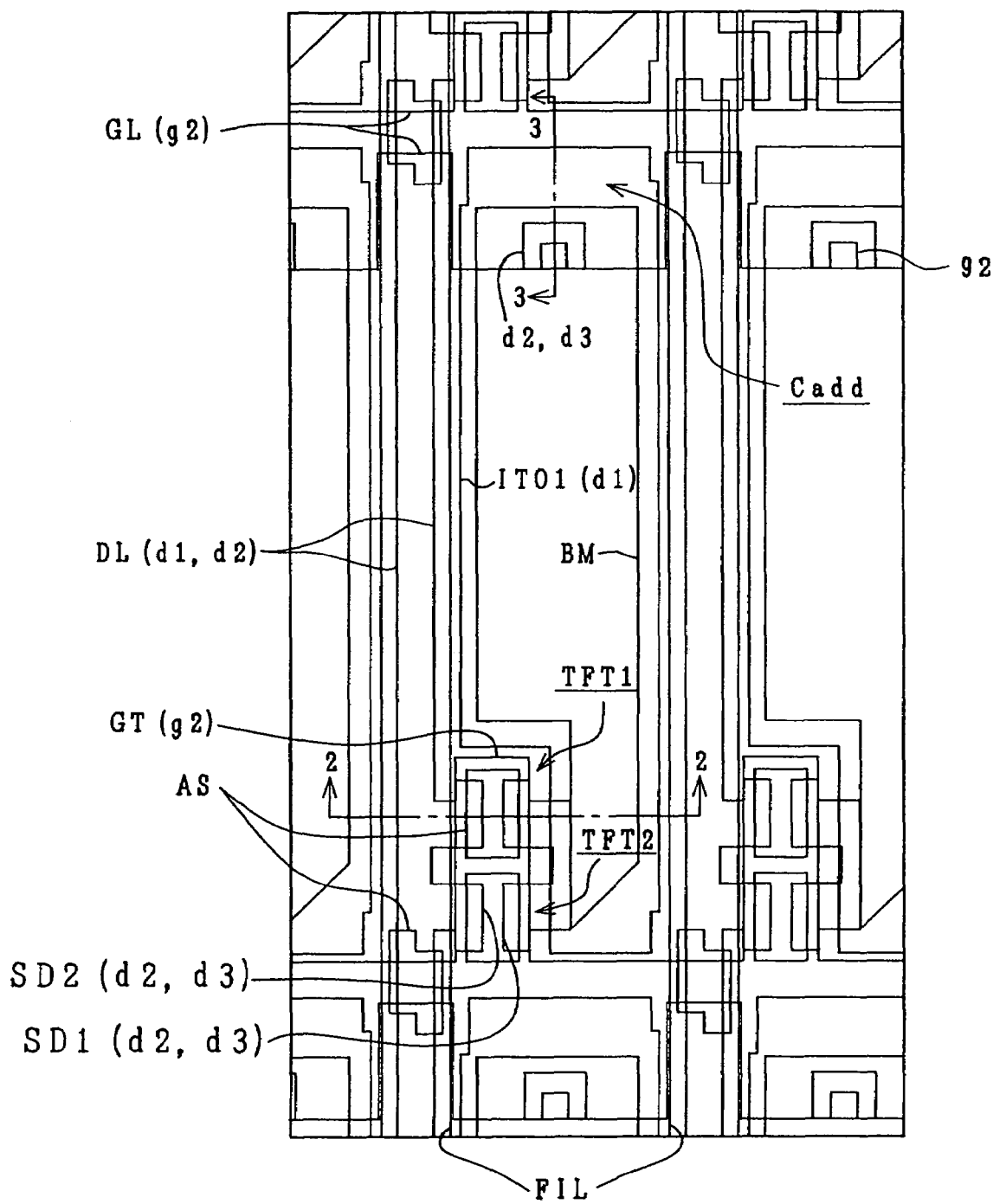
FIG. 1 is a top plan view showing an essential portion of one pixel of the liquid crystal display of a color liquid crystal display circuit of active matrix type, to which is applied the present invention.

The present invention, other objects of the present invention, and other features of the present invention will become apparent from the following description to be made with reference to the accompanying drawings.

<<Active Matrix Liquid Crystal Display Device>>

Here will be described in the following the construction of the present invention in connection with embodiments of a color liquid crystal display device of active matrix type, to which is applied the present invention. Incidentally, the parts having identical functions are designated at identical reference characters throughout all the Figures for describing the embodiments, and their repeated descriptions will be omitted.

<<Summary of Matrix Portion>>

Figure 2:
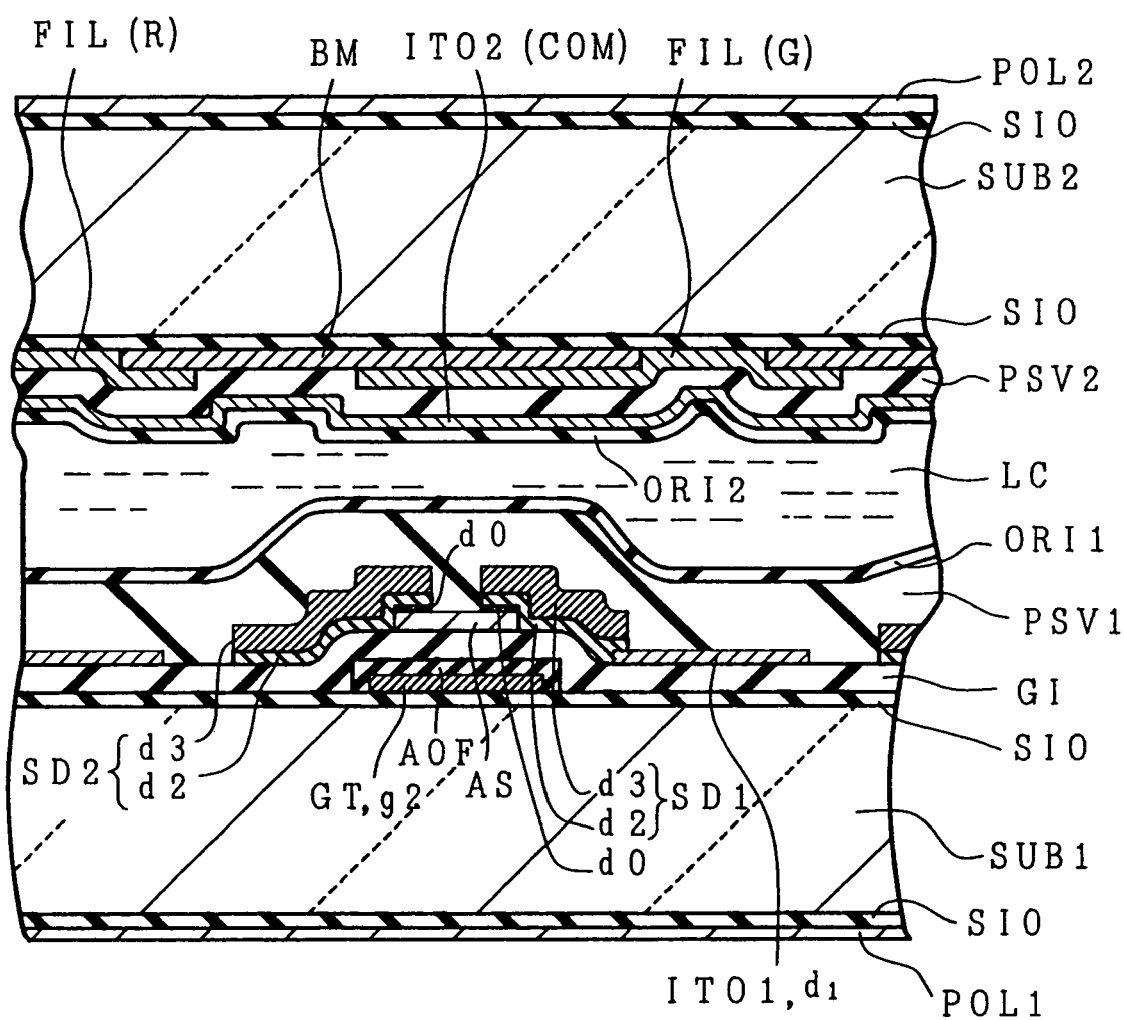
FIG. 2 is a section taken along line 2-2 of FIG. 1 and shows one pixel and its peripheral portion.
Figure 3:
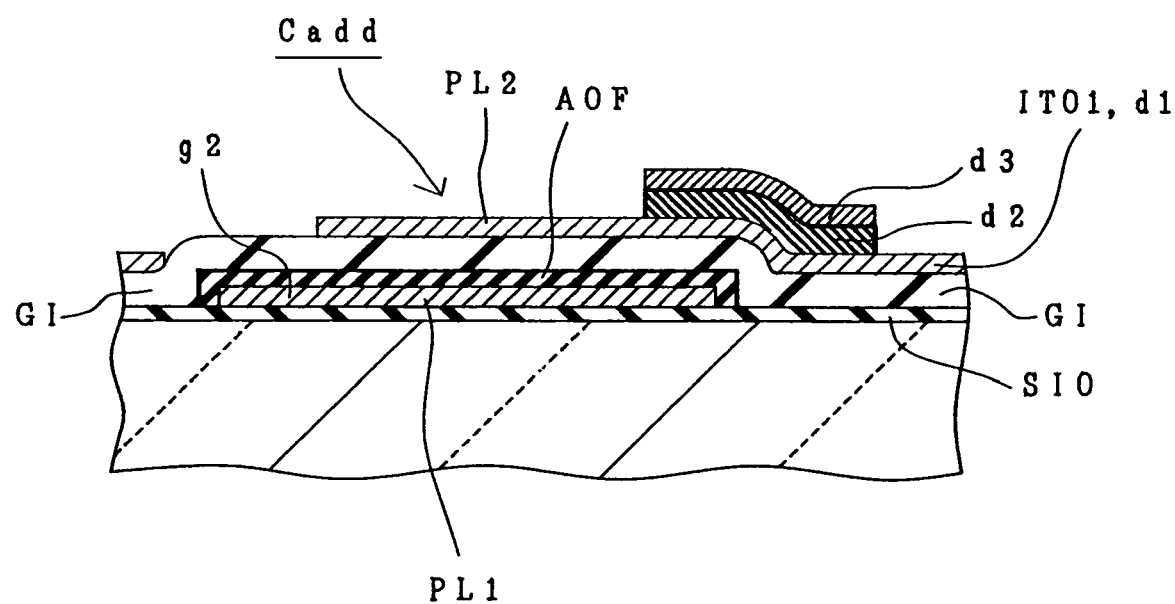
FIG. 3 is a section taken along line 3-3 of FIG. 1 and shows an additional capacitor Cadd.
Figure 4:
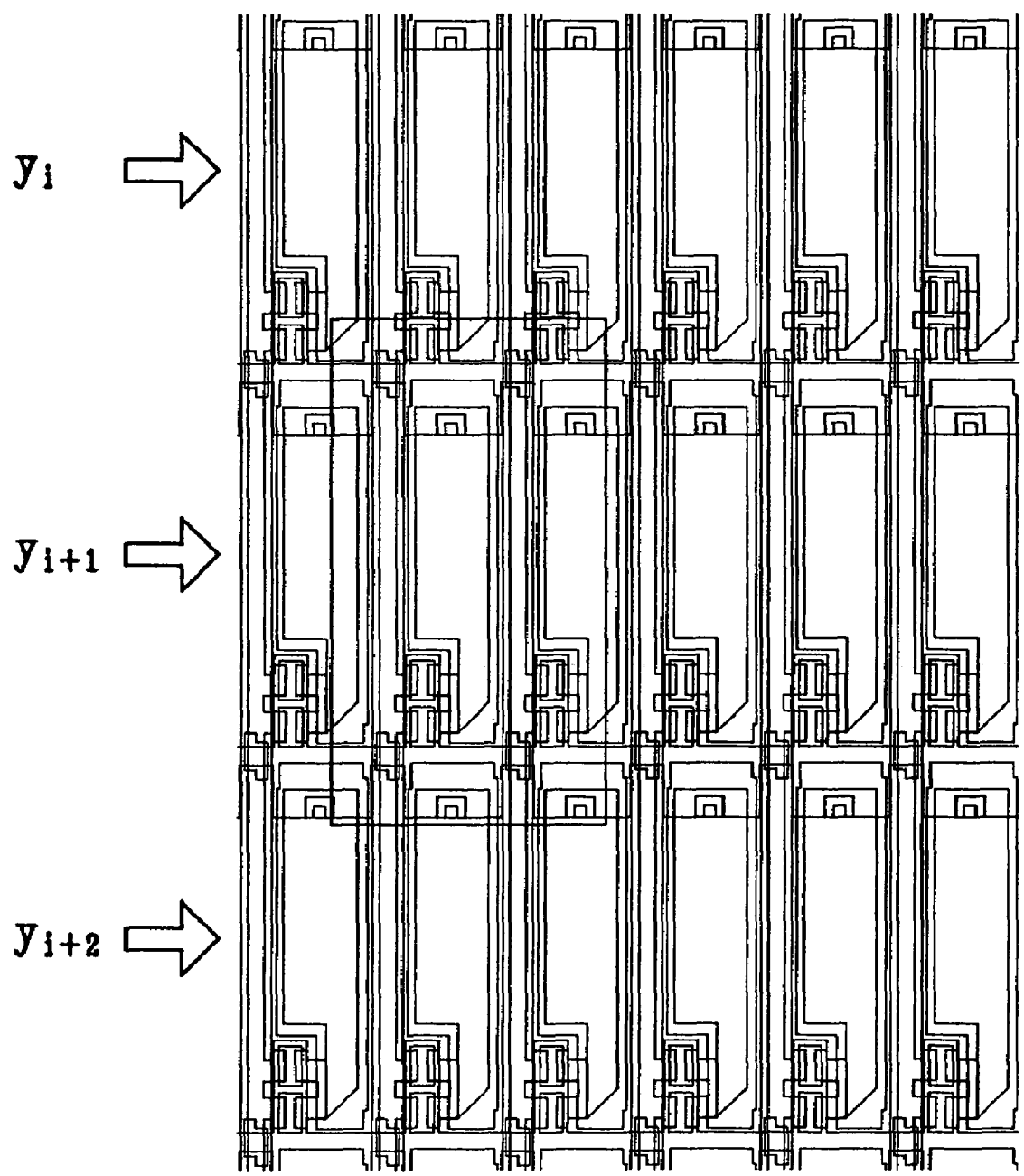
FIG. 4 is a top plan view showing an essential portion of a liquid crystal display circuit arranged with a plurality of pixels shown in FIG. 1.

FIG. 1 is a top plan view showing one embodiment of one pixel and its peripheral portion of the active matrix type color liquid crystal display device to which is applied the present invention. FIG. 2 is a section taken along line 2-2 of FIG. 1. FIG. 3 is a section taken along line 3-3 of FIG. 1. On the other hand, FIG. 4 is a top plan view showing the case in which a plurality of pixels shown in FIG. 1 are arranged.

As shown in FIG. 1, each pixel is arranged in a cross region (defined by four signal lines) between two adjacent scanning signal lines (e.g., gate signal lines or horizontal signal lines) GL and two video signal lines (e.g., drain signal lines or vertical signal lines) DL. Each pixel includes a thin film transistor TFT, a transparent pixel electrode ITO1 and a latching capacitor Cadd. The scanning signal lines GL are extended in the column direction and arranged in plurality in the row direction. The video signal lines DL are extended in the row direction and arranged in plurality in the column direction.

As shown in FIG. 2, the thin film transistor TFT and the transparent pixel electrode ITO1 are formed at the side of a lower transparent glass substrate SUB1 across a liquid crystal layer LC, and a color film FIL and a back matrix pattern BM for light shielding are formed at the side of an upper transparent glass substrate SUB2. The side of the lower transparent glass substrate SUB1 is made to have a thickness of about 1.1 mm, for example. On the both surfaces of the transparent glass substrates SUB1 and SUB2, there are formed silicon oxide layers SIO which are deposited by the dip treatment. Accordingly, even if there exist sharp defects at the surfaces of the transparent glass substrates SUB1 and SUB2, the scanning signal lines GL as well as the color filter FIL to be deposited thereon can be protected from the sharp defects since the defects are covered with the silicon oxide layer SIO.

On the surface of the upper transparent glass substrate SUB2 at the inner side (or the side of the liquid crystal LC), there are sequentially laminated the light-shielding film BM, the color filter FIL, a passivation film PSV2, a common transparent pixel electrode ITO2 (or COM) and an upper orientation film ORI2.

<<Summary of Matrix Periphery>>

Figure 16:
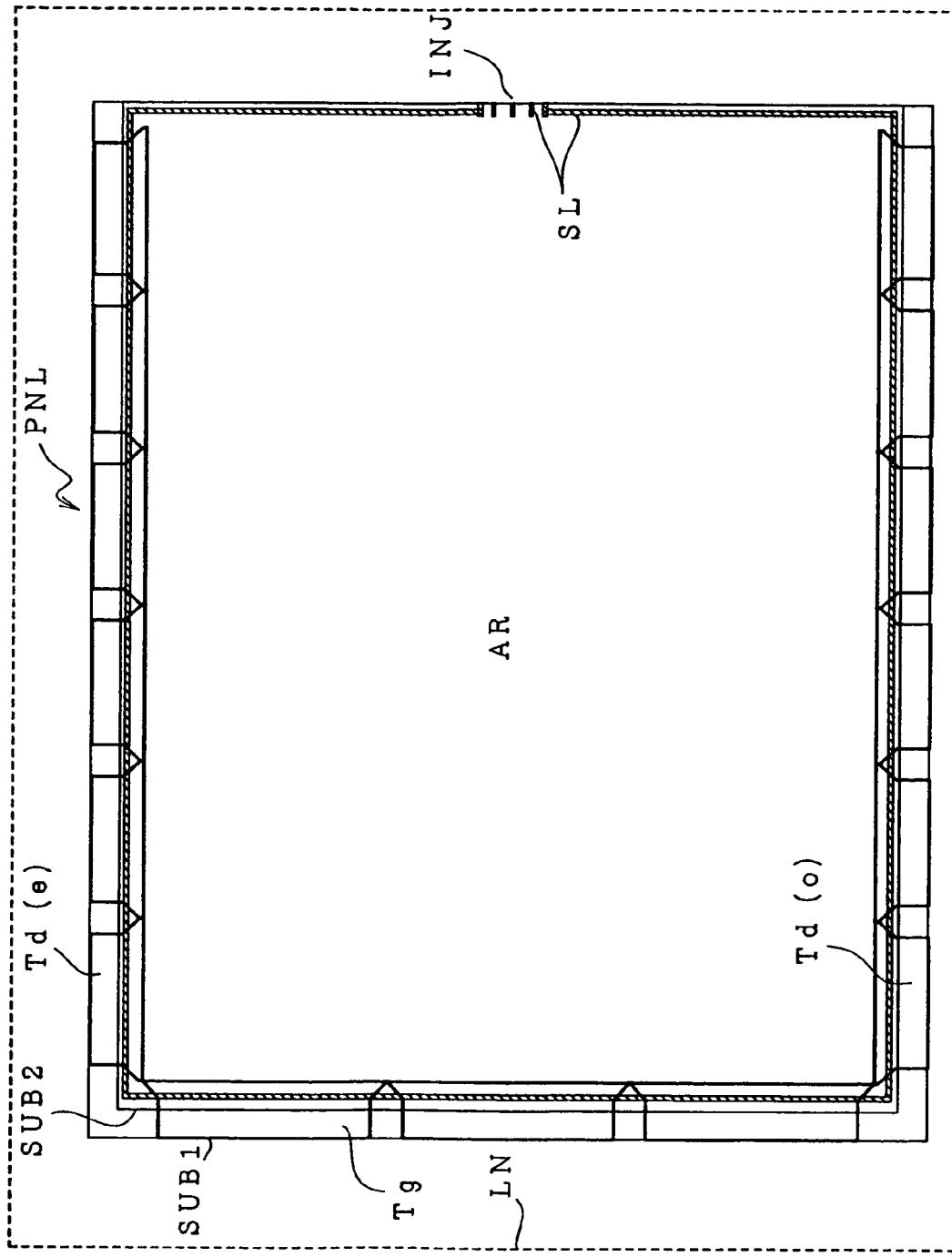
FIG. 16 is a top plan view for explaining the construction a matrix peripheral portion of a display panel.
Figure 17:
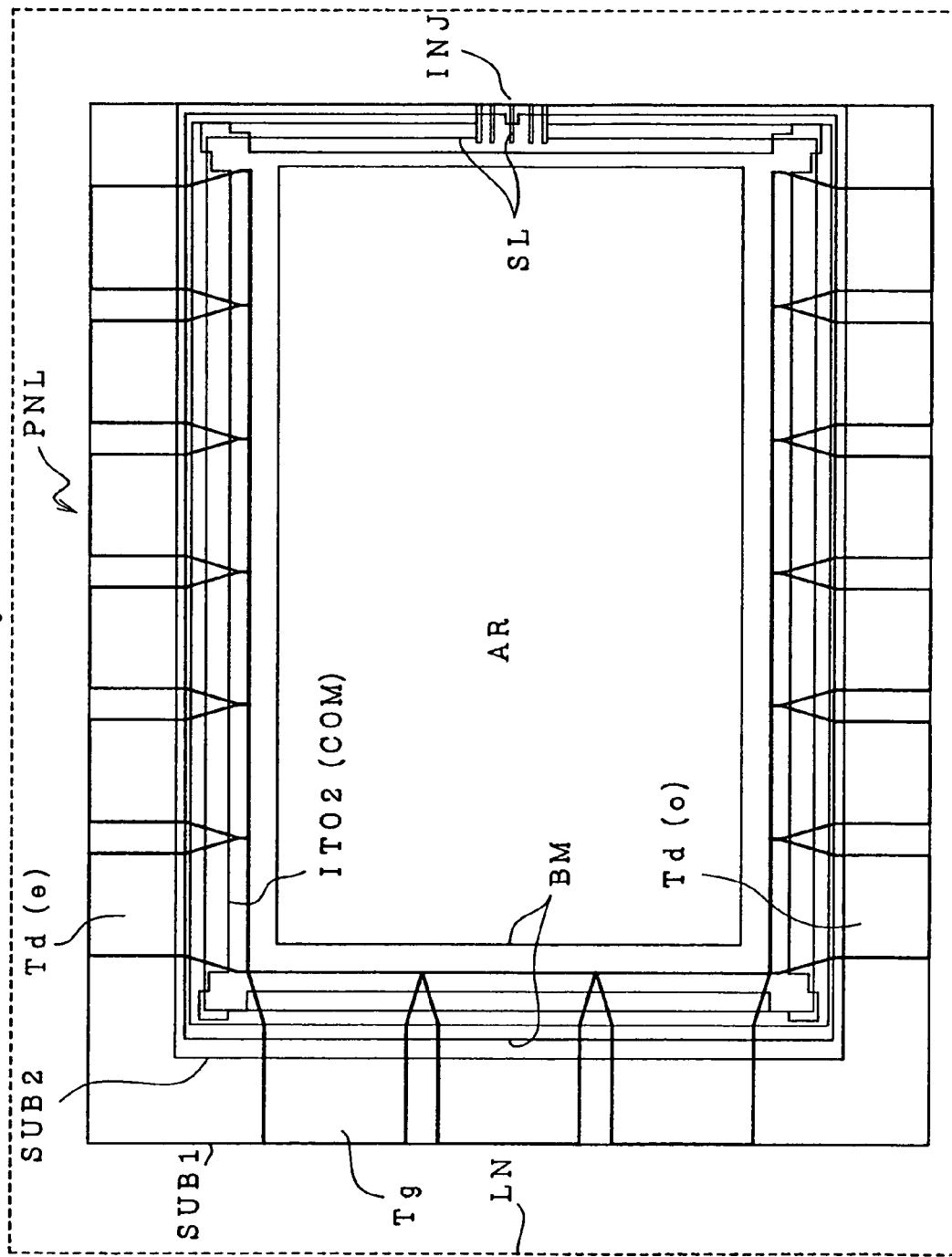
FIG. 17 is a panel top plan view for exaggerating and explaining the peripheral portion of FIG. 16 more specifically.
Figure 18:
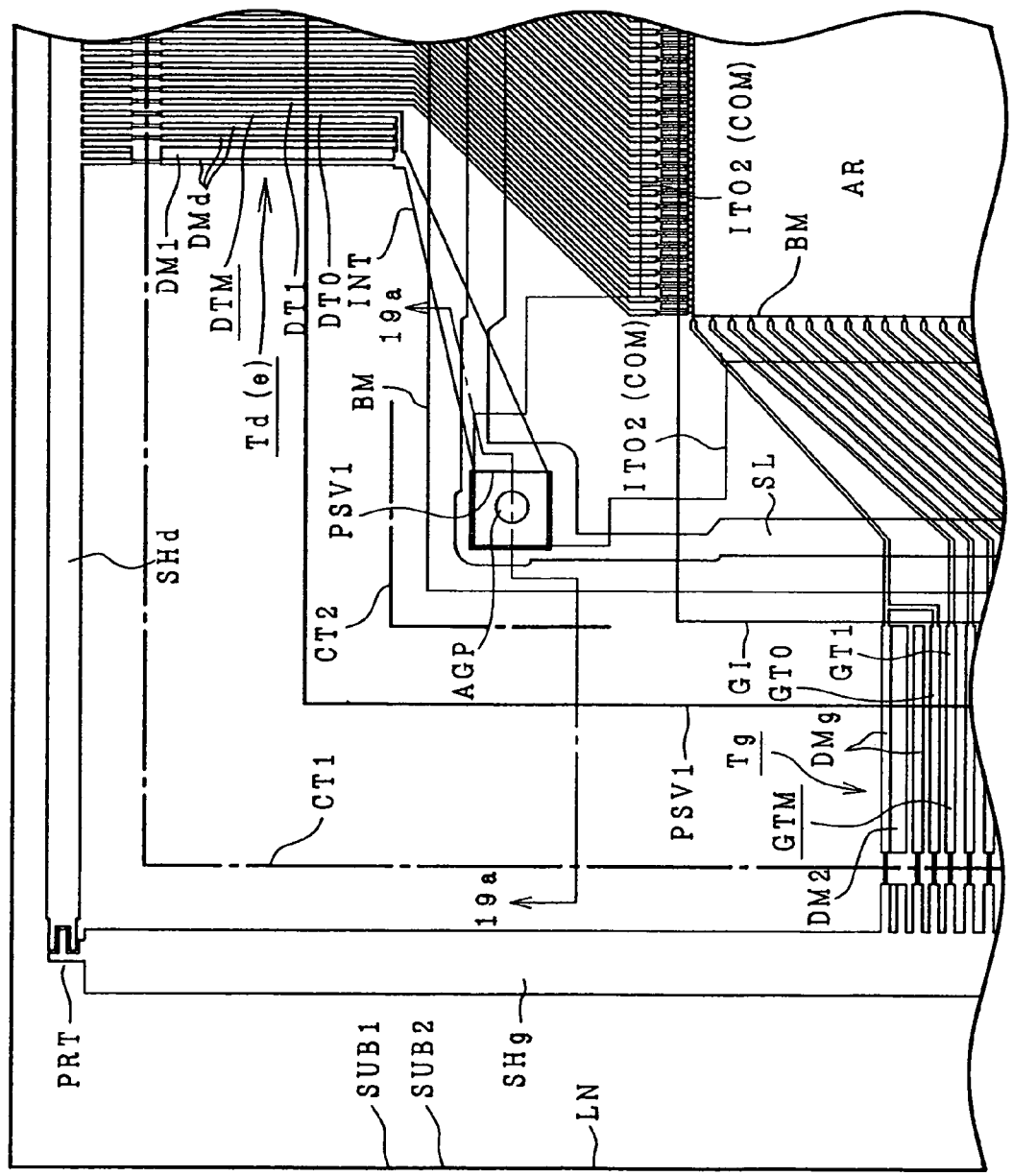
FIG. 18 is an enlarged top plan view showing a corner of a display panel including an electric connection portion of upper and lower substrates.
Figure 19:
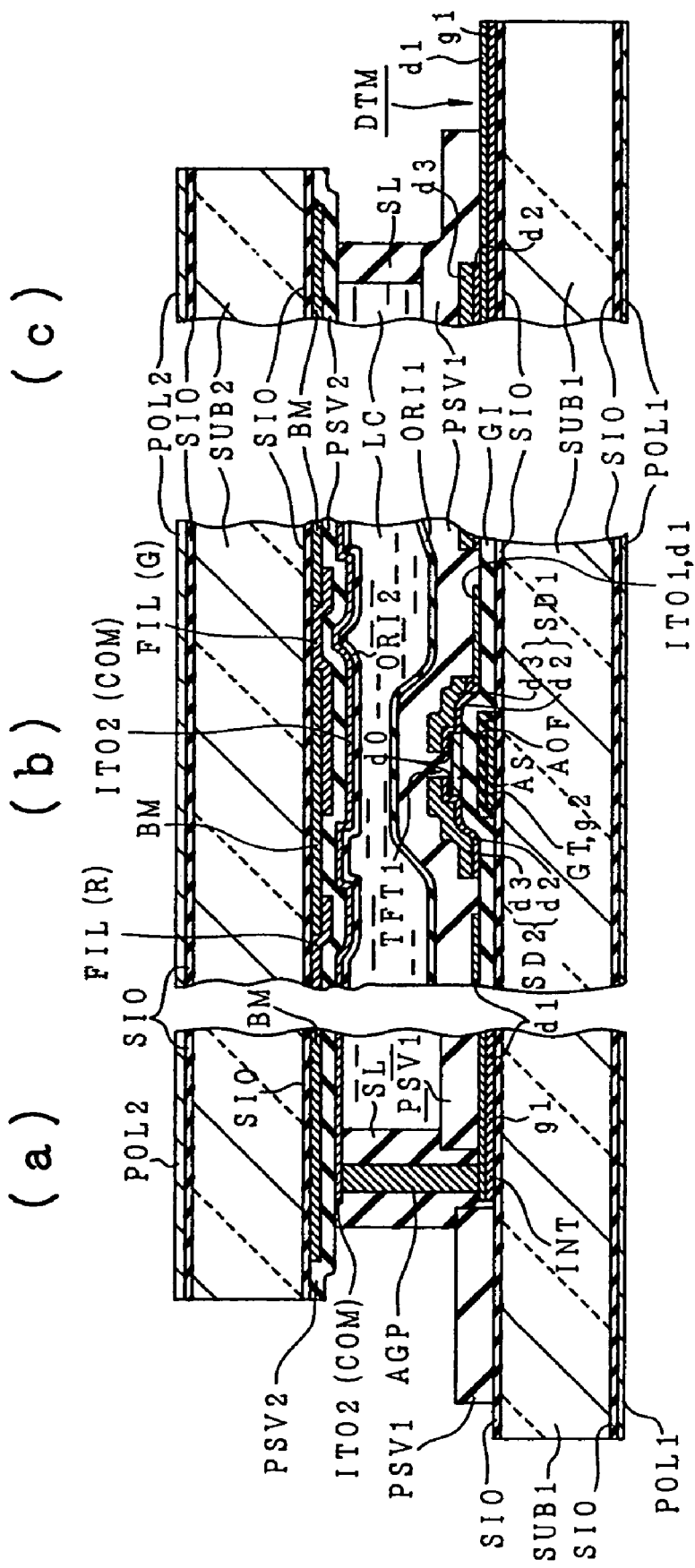
FIG. 19 is a section showing the pixel portion of a matrix at the center and the vicinity of a panel corner-and the vicinity of a video signal terminal portion at the two sides.
Figure 20:
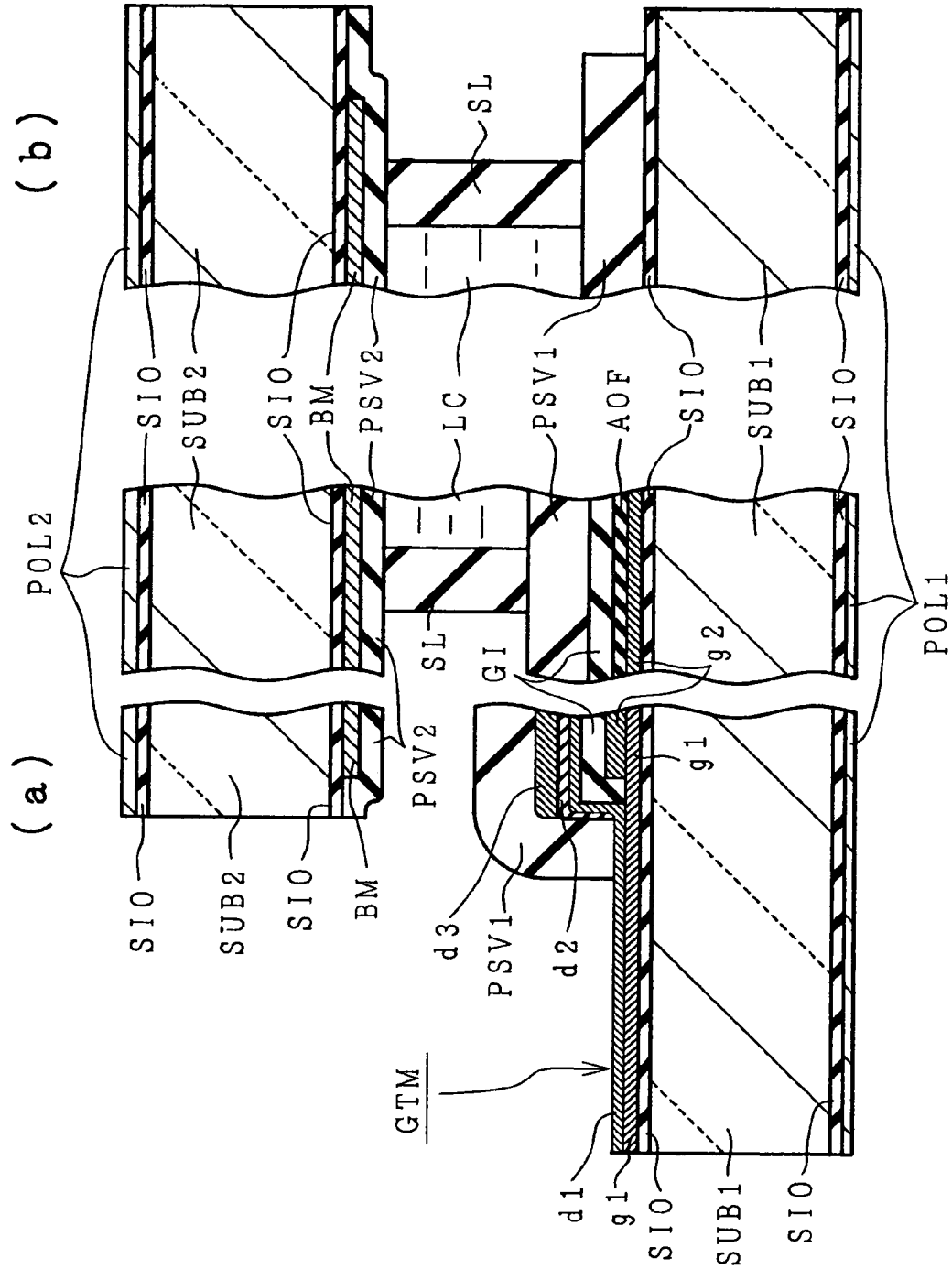
FIG. 20 is a section showing panel edge portions with and without a scanning signal terminal at the lefthand and righthand sides.

FIG. 16 is a top plan view showing an essential portion of the periphery of a matrix (AR) of a display panel PNL including the upper and lower glass substrates SUB1 and SUB2. FIG. 17 is a top plan view further exaggerating the peripheral portion. FIG. 18 is an enlarged top plan view showing the vicinity of a seal portion SL corresponding to the lefthand upper corner of the panel of FIGS. 16 and 17. Moreover, FIG. 19 presents a section of FIG. 2 at the lefthand side, a section taken from line 19a-19a of FIG. 18 at the righthand side, and a section showing the vicinity of an external connection terminal DTM, to which is connected a video signal drive circuit. Likewise, FIG. 20 presents a section showing the vicinity of an external connection terminal GTM, to which is connected a scanning circuit, at the lefthand side and a section showing the vicinity of a seal portion having no external connection terminal at the righthand side.

Figure 21:
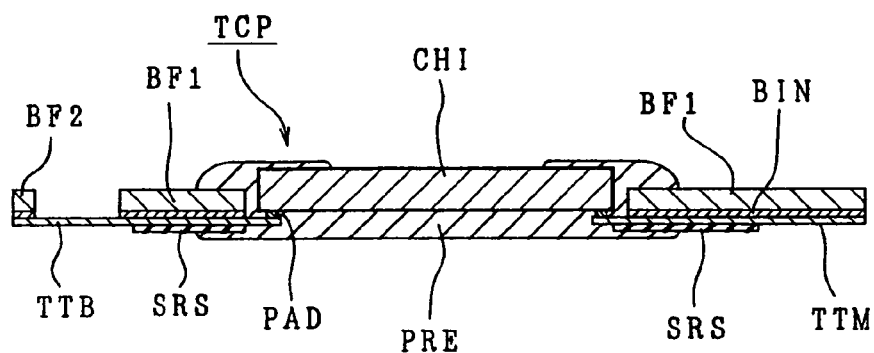
FIG. 21 is a section showing a structure of a tape carrier package TCP, in which an integrated circuit chip CHI constituting a drive circuit is mounted on a flexible wiring substrate.

In a fabrication of this panel, a plurality of devices are simultaneously worked and divided by a single sheet of glass substrate so as to improve the throughput, if the panel has a small size, but a glass substrate having a standardized size for any kind is worked and is reduced to the sizes matching the individual kinds so as to share the fabrication facilities, if the size is large. In either case, the glass is cut after a series of steps. In FIGS. 16 to 18 showing the latter example, FIGS. 16 and 17 show the state after the upper and lower substrates SUB1 and SUB2 have been cut, and FIG. 18 shows the state before the cutting operation. Letters LN designate the edges of the two substrates before the cutting operation, and characters CT1 and CT2 designates the individual positions at which the substrates SUB1 and SUB2 are to be cut. In either case, the size of the upper substrate SUB2 is so limited to the inside of the lower substrate SUB1 that the portions (as located at the upper and lower sides and the lefthand side in the Figures), in which external connection terminal groups Tg and Td (although suffixes are omitted) are present in the completed state, may be exposed to the outside. The terminal groups Tg and Td are named such that the scanning line connecting terminal GTM, the video signal circuit connecting terminal DTM and their leading lines are collected in plurality at the unit of a tape carrier package TCP (as shown in FIGS. 20 and 21) on which is packaged an integrated circuit chip CHI. The leading line from the matrix portion of each group to the external connection terminal portion is inclined toward the two ends. This is because the terminals DTM and GTM of the display panel PNL are made to match the array pitch of the package TCP and the connection terminal pitch at each package TCP.

Between and along the edges of the transparent glass plates SUB1 and SUB2, there is formed the seal pattern SL for sealing the liquid crystal LC excepting a liquid crystal entrance INJ. The seal material is made of an epoxy resin, for example. The common transparent pixel electrode ITO2 at the side of the upper transparent glass substrate SUB2 is connected at the four corners in the present embodiment with a leading line INT, which is formed at the side of the lower transparent glass substrate SUB1, in at least one portion by a silver paste material AGP. The leading line INT is formed at the same fabrication step as that of the later-described gate terminal GTM and drain terminal DTM.

The orientation films ORI1 and ORI2, the transparent pixel electrode ITO1, the common transparent pixel electrode ITO2, and the individual layers are formed in the seal pattern SL. Polarization plates POL1 and POL2 are individually formed on the outer surfaces of the lower transparent glass substrate SUB1 and the upper transparent glass substrate SUB2. The liquid crystal LC is filled in the region which is defined by the seal pattern SL between the lower orientation film ORI1 and the upper orientation film ORI2 for setting the orientations of the liquid crystal molecules. The lower orientation film ORI1 is formed over a passivation film PSV1 at the side of the lower transparent glass substrate SUB1.

This liquid crystal display device is assembled: by superposing the individual layers at the sides of the lower transparent glass substrate SUB1 and the upper transparent glass substrate SUB2; by forming the seal pattern SL at the side of the substrate SUB2; by superposing the lower transparent glass substrate SUB1 and the upper transparent glass substrate SUB2; by injecting the liquid crystal LC from the opening INJ of the seal member SL to seal the injection entrance INJ with the epoxy resin or the like; and by cutting the upper and lower substrates.

<<Thin Film Transistor TFT>>

If a positive bias is applied to the gate electrode GT, the thin film transistor TFT has its channel resistance reduced between its source and drain. If the bias is reduced to zero, the thin film transistor TFT operates to have its channel resistance increased.

The thin film transistor TFT of each pixel is divided into two (or plurality) in the pixel so that it is composed of thin film transistors (or divided thin film transistors) TFT1 and TFT2. These thin film transistors TFT1 and TFT2 are individually made to have a substantially equal size (in the channel length and width). Each of these divided thin film transistors TFT1 and TFT2 is composed mainly of a gate electrode GT, a gate insulating film GI, an i-type (i.e., intrinsic type not doped with a conductivity type determining impurity) amorphous silicon (Si) semiconductor layer AS, and a pair of source electrode SD1 and drain electrode SD2. Incidentally, the source and drain are intrinsically determined in dependence upon the bias polarity inbetween, and this polarity is inverted during the operation in the circuit of the present display device. Thus, it should be understood that the source and drain are interchanged during the operation. In the following description, however, one is fixed as the source whereas the other is fixed as the drain, for conveniences only.

<<Gate Electrode GT>>

Figure 5:
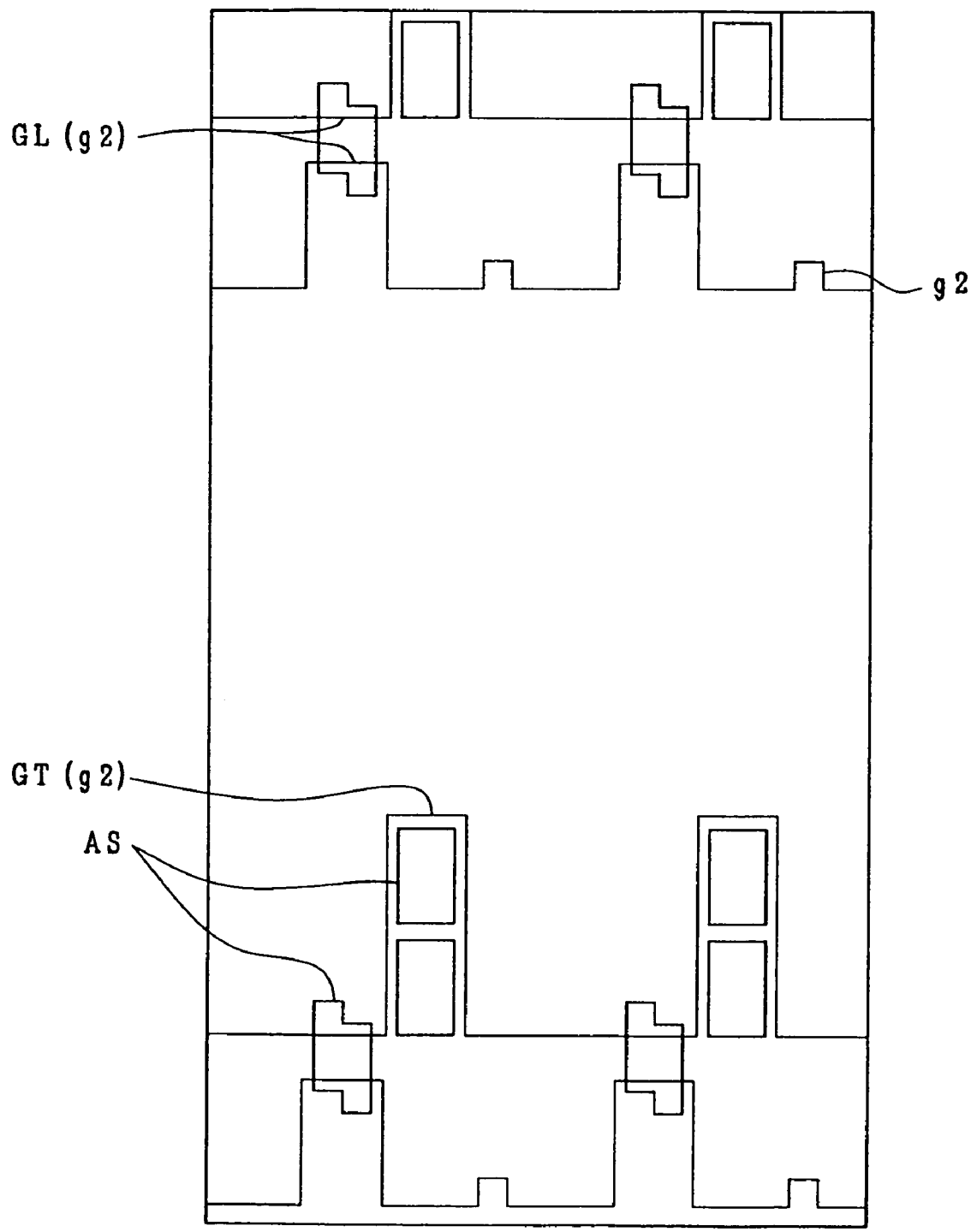
FIG. 5 is a top plan view drawing only layers q2 and AS of the pixel shown in FIG. 1.

The gate electrode GT is formed to project perpendicularly (i.e., upward, as viewed in FIGS. 1 and 5) from the scanning signal lines GL (or branched in the "T-shape"), as shown in detail in FIG. 5 (presenting a top plan view showing the second conductive layer g2 and i-type semiconductor layer AS of FIG. 1 only). The gate electrode GT is extended to the regions to be individually formed with the thin film transistors TFT1 and TFT2. These thin film transistors TFT1 and TFT2 have their individual gate electrodes GT integrated (as their common gate electrode) to merge into the scanning signal line GL. The gate electrode GT is constituted by the single level conductive layer g2. The second conductive layer g2 is formed, for example, by sputtering aluminum (Al) in the thickness of about 1,000 to 5,500 angstroms. On the gate electrode GT, there is provided an anodized oxide film AOF of Al.

This gate electrode GT is made so slightly large as to cover the semiconductor layer AS completely (as viewed upward), as shown in FIGS. 1 and 2 and FIG. 5. In case, therefore, back lights BL such as fluorescent lamps are attached to the bottom of the substrate SUB1, this opaque Al gate electrode GT establishes a shadow to shield the semiconductor layer AS from the back lights, thus substantially eliminating the conducting phenomenon due to the optical irradiation, i.e., the deterioration of the OFF characteristics of the TFTs. Here, the intrinsic size of the gate electrode GT is given the least necessary width (including the positioning allowance of the gate electrode GT, the source electrode SD1 and the drain electrode SD2) for extending between the source and drain electrodes SD1 and SD2. The depth for determining that channel width W is determined in dependence upon the factor W/L determining the mutual conductance gm, i.e., the ratio to the distance (i.e., the channel length) L between the source and drain electrodes SD1 and SD2. The size of the gate electrode GT in the present liquid crystal display device is naturally made larger than the aforementioned intrinsic size.

<<Scanning Signal Line GL>>

The scanning signal line GL is constituted by the second conductive film g2. The second conductive film g2 of the scanning signal line GL is formed at the same step as and integrally with the second conductive film g2 of the gate electrode GT. Moreover, the scanning signal line GL is also formed thereon with the anodized oxide film AOF of Al.

<<Gate Insulating Film GT>>

The insulating film GI is used as the individual gate insulating films of the thin film transistors TFT1 and TFT2. The insulating film GI is formed over the gate electrode GT and the scanning signal line GL. The insulating film GI is formed of, for example, a silicon nitride film prepared by the plasma CVD, to have a thickness of 1,200 to 2,700 angstroms (e.g., about 2,000 angstroms in the present liquid crystal display device). The gate insulating film GI is formed to enclose the entirety of the matrix portion AR, as shown in FIG. 18, and to have its peripheral portion removed to expose the external connection terminals DTM and GTM to the outside.

<<i-Type Semiconductor Layer AS>>

The i-type semiconductor layer AS is used as the individual channel forming regions of the thin film transistors TFT1 and TFT2 divided into a plurality of parts, as shown in FIG. 5. The i-type semiconductor layer AS is formed of an amorphous silicon film or polycrystalline silicon film to have a thickness of about 200 to 2,200 angstroms (e.g., about 2,000 angstroms in the present liquid crystal display device).

This i-type semiconductor layer AS is formed subsequent to the formation of the $Si_3N_4$ gate insulating film GI by changing the components of supply gases but by using the common plasma CVD system such that it is not exposed from the system to the outside. On the other hand, an N(+)-type layer d0 (shown in FIG. 2) doped with 2.5% of phosphor (P) for the ohmic contact is likewise formed subsequently to have a thickness of about 200 to 500 angstroms (e.g., about 300 angstroms in the present liquid crystal display device). After this, the lower substrate SUB1 is taken out of the CVD system, and the N(+)-type layer d0 and the i-type AS are patterned into independent islands by the photographic technology, as shown FIGS. 1 and 2 and FIG. 5.

The i-type semiconductor layer As is also formed between the intersecting portions (or crossover portions) of the scanning signal line GL and the video signal line DL, as shown in FIGS. 1 and 5. This crossover i-type semiconductor layer As is formed to reduce the short-circuiting between the scanning signal line GL and the video signal line DL at the intersecting portion.

<<Transparent Pixel Electrode ITO1>>

The transparent pixel electrode ITO1 constitutes one of the parts of a pixel electrode of a liquid crystal display.

The transparent pixel electrode ITO1 is connected with both the source electrode SD1 of the thin film transistor TFT1 and the source electrode SD1 of the thin film transistor TFT2. Even if, therefore, one of the thin film transistors TFT1 and TFT2 become defective, a suitable portion may be cut by a laser beam in case the defect invites an adverse action. Otherwise, the situation may be left as it is because the other thin film transistor is normally operating. Incidentally, both the two thin film transistors TFT1 and TFT2 scarcely become defective, and the probability of the point defect or line defect can be drastically reduced by that redundant system. The transparent pixel electrode ITO1 is formed of a first conductive film d1, which is made of a transparent conductive film (of Indium-Tin-Oxide, i.e., ITO or NESA film) to have a thickness of 1,000 to 2,000 angstroms (e.g., about 1,400 angstroms in the present liquid crystal display device).

<<Source Electrode SD1 and Drain Electrode SD2>>

Figure 6:
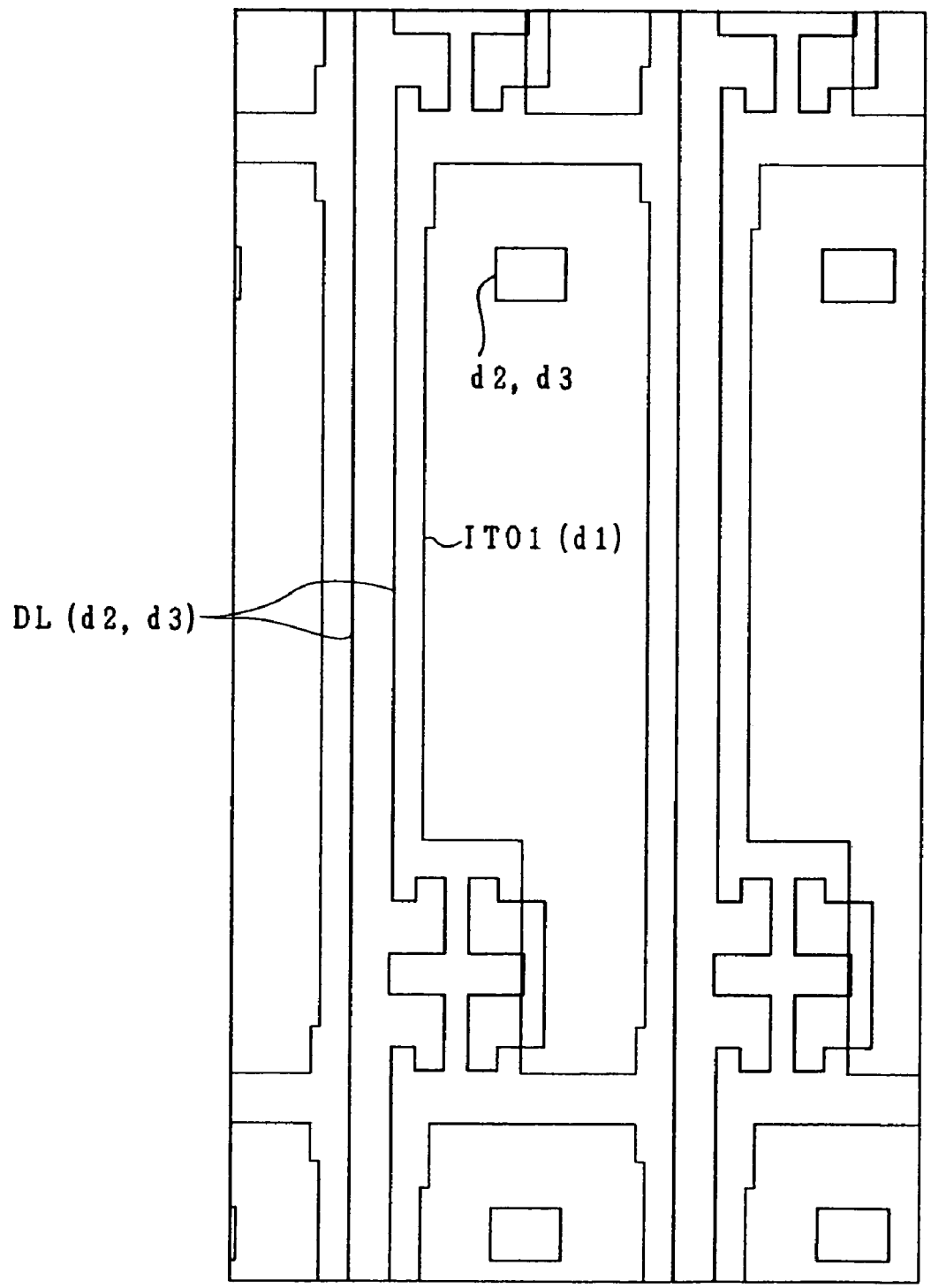
FIG. 6 is a top plan view drawing only layers d1, d2 and d3 of the pixel shown in FIG. 1.

The individual source electrodes SD1 and drain electrodes SD2 of the divided thin film transistors TFT1 and TFT2 are formed over the semiconductor layer AS and separately from each other, as shown in FIGS. 1 and 2 and FIG. 6 (presenting a top plan view showing the layers d1 to d3 of FIG. 1 only).

Each of the source electrode SD1 and the drain electrode SD2 is formed by overlaying a second conductive film d2 and a third conductive film d3 sequentially from the lower side contacting with the N(+)-type semiconductor layer d0. These second conductive film d2 and third conductive film d3 of the source electrode SD1 are formed at the same fabrication step as those of the drain electrode SD2.

The second conductive film d2 is formed of a sputtered chromium (Cr) film to have a thickness of 500 to 1,000 angstroms (e.g., about 600 angstroms in the present liquid crystal display device). The Cr film is formed to have a thickness no more than 2,000 angstroms because it establishes a high stress if it is made excessively thick. The Cr film has an excellent contact with the N(+)-type semiconductor layer d0. The Cr film constitutes the so-called "barrier layer" preventing the Al of the third conductive film d3 described hereinafter from diffusing into the N(+)-type semiconductor layer d0. The second conductive film d2 may be made of not only the aforementioned Cr film but also a refractory metal (e.g., Mo, Ti, Ta or W) film or its silicide (e.g., $MoSi_2$, $TiSi_2$, $TaSi_2$ or $WSi_2$).

The third conductive film d3 is formed by sputtering Al to have a thickness of about 3,000 to 5,000 angstroms (e.g., about 4,000 angstroms in the present liquid crystal display device). The Al layer is less stressed than the Cr layer so that it can be formed to have a larger thickness thereby to reduce the resistances of the source electrode SD1, the drain electrode SD2 and the video signal line DL. The third conductive film d3 may be formed of not only the pure Al film but also an Al film containing silicon or copper (Cu) as an additive.

After the second conductive film d2 and the third conductive film d3 have been patterned with the same mask pattern, the N(+)-type layer d0 is removed by using the same photographic mask or the second conductive film d2 and the third conductive film d3. Specifically, the N(+)-type layer d0 left on the i-th layer AS is removed in self-alignment while leaving the second conductive film d2 and the third conductive film d3 as they are. Since, at the same time, the N(+)-type layer d0 is etched to remove its whole thickness, the i-th layer AS is slightly etched off at its surface portion, but this removal may be controlled by the etching period.

The source electrode SD1 is connected with the transparent pixel electrode ITO1. The source electrode SD1 is formed along the stepped shape (i.e., the step corresponding to the sum of the thicknesses of the second conductive film g2, the anodized oxide film AOF, the i-type semiconductor layer AS and the N(+)-type semiconductor layer d0) of the i-type semiconductor layer AS. More specifically, the source electrode SD1 is composed of the second conductive film d2 formed along the stepped shape of the i-type semiconductor layer AS and the third conductive film d3 formed over the second conductive film d2. This third conductive film d3 of the source electrode SD1 is formed to ride over the i-type semiconductor AS, because the Cr film of the second conductive film d2 cannot be made so thick because of the increase in the stress as to ride over the stepped shape of the i-type semiconductor layer AS. In short, the second conductive film d2 is made thick to improve the step coverage. The third conductive film d3 can be made thick so that it can highly contribute to the reduction of the resistance of the source electrode SD1 (as well as those of the drain electrode SD2 and the video signal line DL).

<<Passivation Film PSV1>>

Over the thin film transistor TFT and the transparent pixel electrode ITO1, there is formed the passivation film PSV1, which is provided mainly for protecting the thin film transistor TFT against humidity or the like. Thus, the passivation film PSV1 to be used is highly transparent and humidity resistant. The passivation film PSV1 is formed of a silicon oxide film or silicon nitride film prepared by the plasma CVD, to have a thickness of about 1 micron.

The passivation film PSV1 is formed, as shown in FIG. 18, to enclose the entirety the matrix portion AR and is removed at its peripheral portion to expose the external connection terminals DTM and GTM to the outside and at the portion, in which the common electrode COM at the side of the upper substrate SUB2 is connected with the external connection terminal connecting leading line INT of the lower substrate SUB1 by means of the silver paste AGP. In connection with the thickness connection between the passivation film PSV1 and the gate insulating film GI, the former is made thick considering the passivation effect whereas the latter is made thin considering the mutual conductance gm of the transistor. As a result, as shown in FIG. 18, the passivation film PSV1 having a high passivation effect is made so larger than the gate insulating film GI as to have its peripheral portion passivated as wide as possible.

<<Shielding Film BM>>

Figure 7:
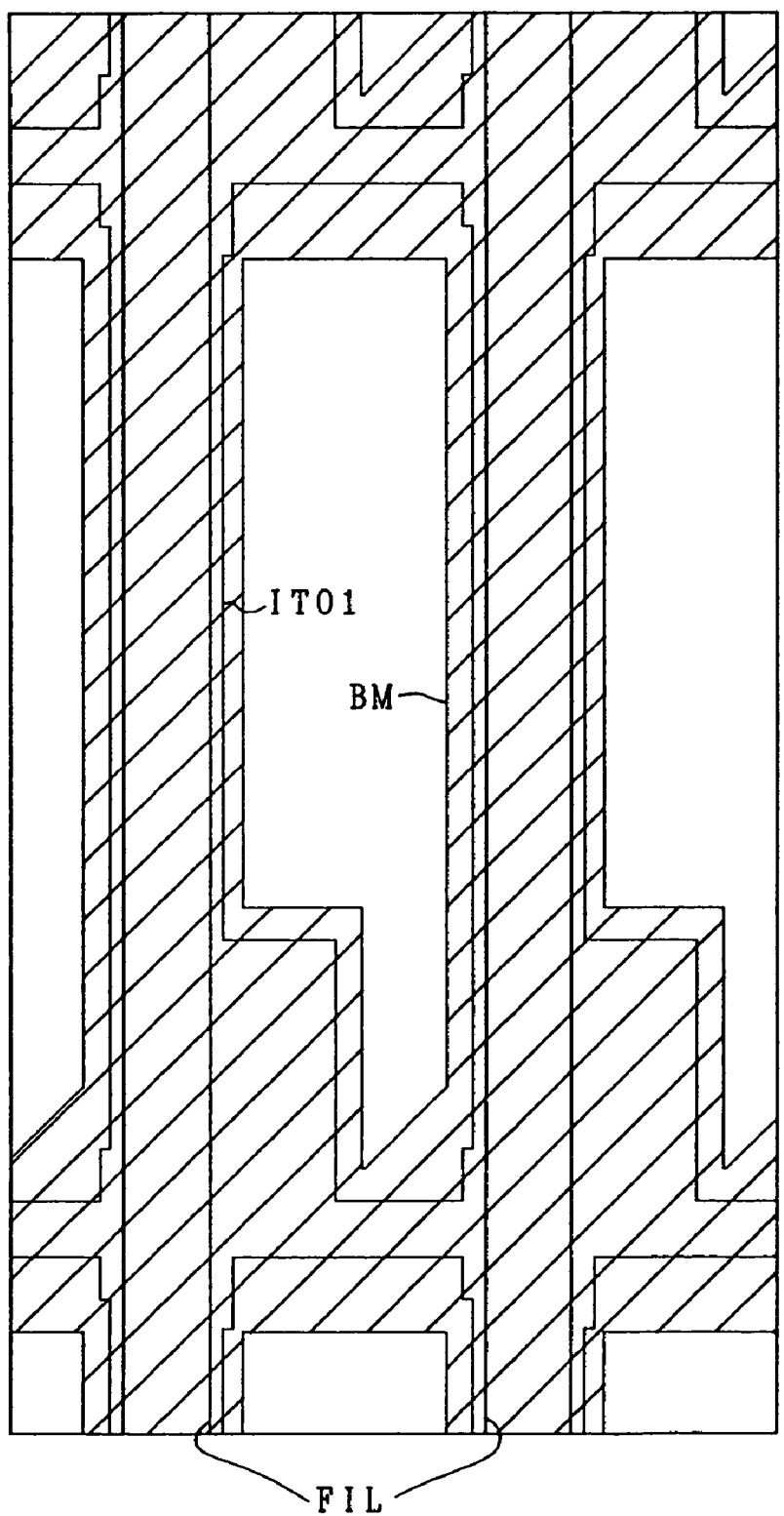
FIG. 7 is a top plan view drawing only a pixel electrode layer, a light-shielding film and a color filter layer of the pixel shown in FIG. 1.

At the side of the upper substrate SUB2, there is disposed the shielding film BM for shielding any external light (i.e., the light coming from the top of FIG. 2) from entering the i-type semiconductor layer AS to be used as the channel forming region, as hatched to have the pattern shown in FIG. 7. Here, FIG. 7 is a top plan view showing only the first conductive layer d1 comprised of the ITO film, the filter layer FIL and the shielding film BM of FIG. 1. The shielding film BM is formed of a film having a high shielding property to the light, e.g., an aluminum film or chromium film. In the present liquid crystal display device, the shielding film BM is formed of a chromium film by the sputtering, to have a thickness of about 1,300 angstroms.

As a result, the common semiconductor layer AS shared by the thin film transistors TFT1 and TFT2 is sandwiched between the upper shielding film BM and the lower but larger gate electrode GT so that it is shielded from the outside natural light or the back lights. The shielding film BM is formed around the pixel, as hatched in FIG. 6. Specifically, the shielding film BM is formed in a lattice (of black matrix) shape, which defines the effective display region of one pixel. As a result, the contour of each pixel is clarified to improve the contrast by the shielding film BM. In other words, this shielding film BM has two functions, i.e., the shielding for the semiconductor layer AS and the black matrix functions. Further, since the portion of the transparent pixel electrode ITO1 (at the lower righthand portion of FIG. 1) opposed to the foot of the rubbing direction is shielded from the light by the shielding film BM, even if a domain is induced at the above portion, the display characteristics are hardly deteriorated because the domain is shaded.

Incidentally, the back lights may be attached to the side of the upper transparent glass substrate SUB2, whereas the lower transparent glass substrate SUB1 may be disposed at the observation side (exposed to the outside).

The shielding film BM is additionally formed at its peripheral portion with a framed pattern, as shown in FIG. 17, which is formed to merge into the pattern of the matrix portion having a plurality of dot-shaped openings, as shown in FIG. 7. The shielding film BM at the peripheral portion is extended to the outside of the seal portion SL, as shown in FIGS. 17 to 20, thereby to prevent the leakage light such as the light reflected from an implemented machine such as a personal computer from entering the matrix portion. On the other hand, the shielding film BM is limited to the inside of the edge of the substrate SUB2 within about 0.3 to 1.0 mm and is formed to avoid the cut region of the substrate SUB2.

<<Color Filter FIL>>

Figure 8:
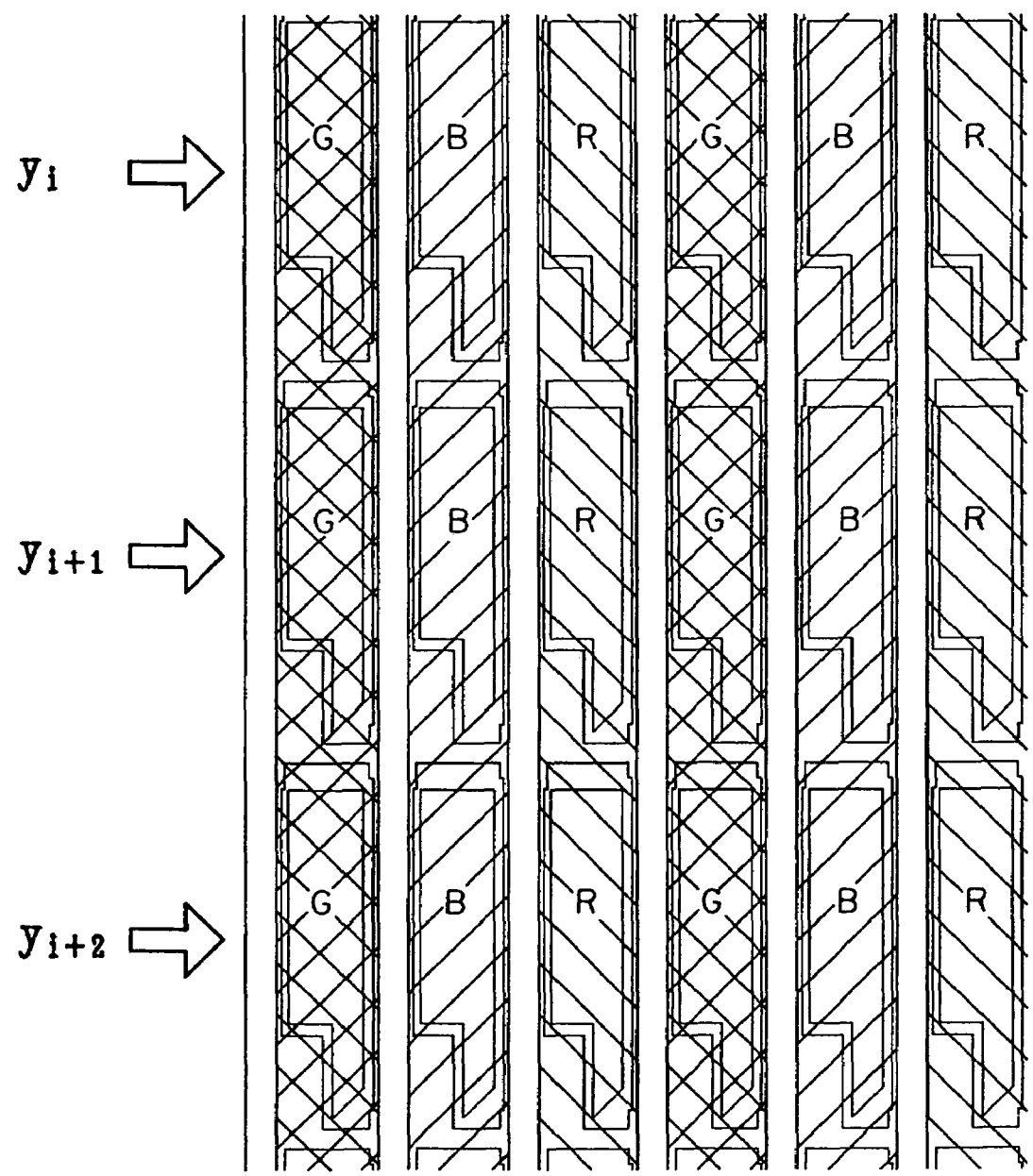
FIG. 8 is a top plan view showing an essential portion of only the pixel electrode layer, the light-shielding layer and the color filter layer shown in FIG. 6.
Figures 9A, 9B:
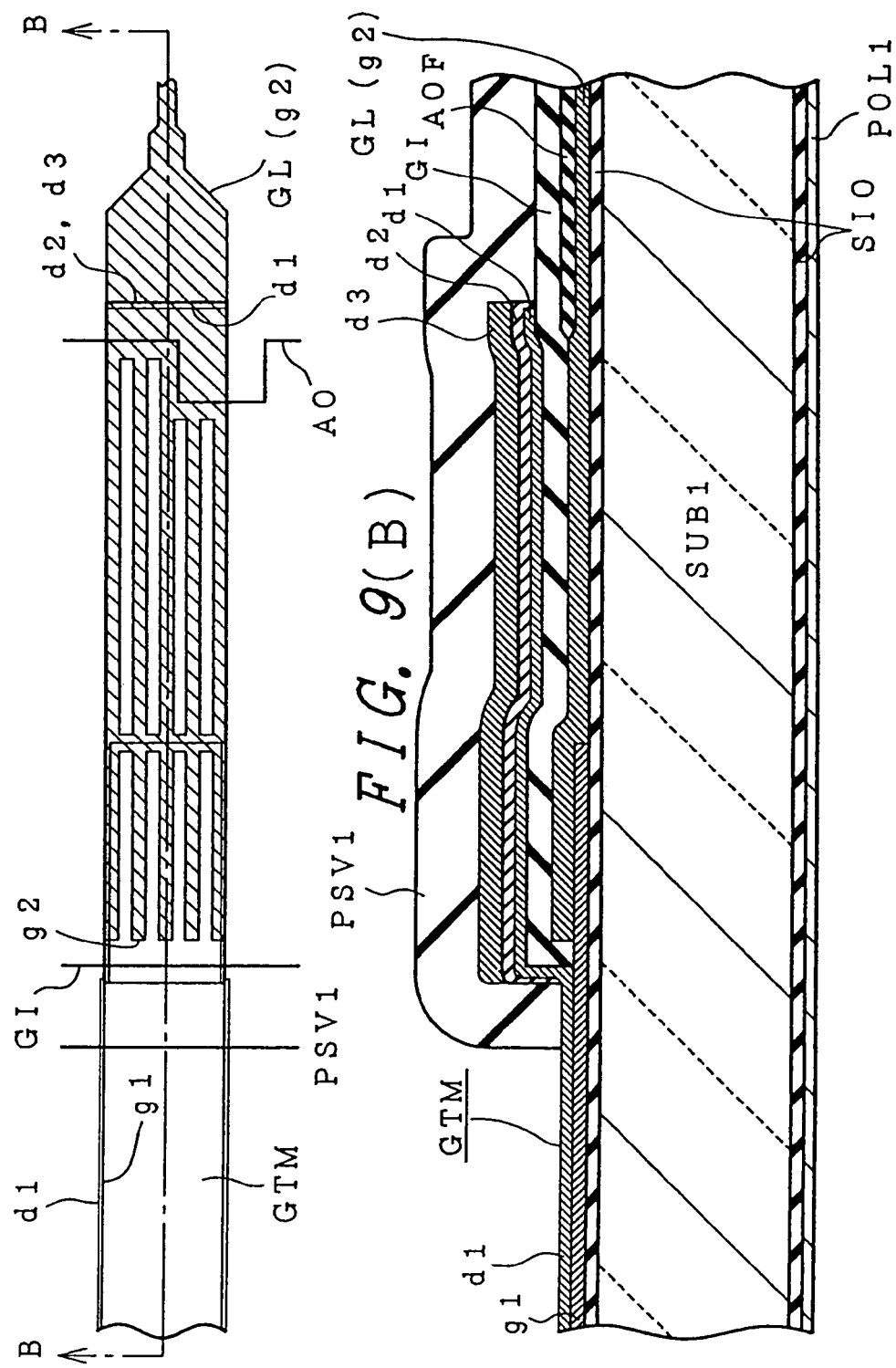
FIG. 9 presents a top plan view and a section showing the vicinity of a connecting portion between a gate terminal GTM and a gate signal line GL.

The color filter FIL is prepared by cooling a dyeing base, which is made of a resin material such as an acrylic resin, with a dye. The color filter FIL is formed (as shown in FIG. 8) in the shape of stripe and in a position to face the pixel. (FIG. 8 shows the first conductive film d1, the black matrix layer BM and the color filter layer FIL of FIG. 4 only, and the B, G and R filters are hatched at 45 degrees and 135 degrees and in a crossing manner, respectively.) The color filter FIL is made slightly large to cover the pixel electrode ITO1 in its entirety, as shown in FIGS. 7 to 9. The shielding film BM is so formed inside of the peripheral edge of the pixel electrode ITO1 as to overlap the color filter FIL and the pixel electrode ITO1.

The color filter FIL can be formed in the following manner. First of all, the dyeing base is formed on the surface of the upper transparent glass substrate SUB2, and the dyeing base other than that in the red color filter forming region is removed by the photolithographic technology. After this, the dyeing base is dyed with the red dye and fixed to form the red filter R. Next, the green filter G and the flue filter B are sequentially formed by the similar steps.

<<Passivation Film PSV2>>

The passivation film PSV2 is provided for preventing the dyes for different colors of the color filter FIL from leaking into the liquid crystal LC. The passivation film PSV2 is made of a transparent resin material such as an acrylic resin or epoxy resin.

<<Common Transparent Pixel Electrode ITO2>>

The common transparent pixel electrode ITO2 is opposed to the transparent pixel electrode ITO1, which is provided for each pixel at the side of the lower transparent glass substrate SUB1, so that the liquid crystal LC has its optical state varied in response to the potential difference (or electric field) between each pixel electrode ITO1 and the common pixel electrode ITO2. This common transparent pixel electrode ITO2 is fed with the common voltage Vcom. In the present embodiment, this common voltage Vcom is set at an intermediate potential between a driving voltage Vdmin at the low level and a driving voltage Vdmax at the high level, both of which are applied to the video signal line DL. An AC voltage may be applied in case the supply voltage of the integrated circuit to be used in the video signal drive circuit is to be reduced to one half. Incidentally, the top plan shape of the common transparent pixel electrode ITO2 should be referred to FIGS. 17 and 18.

<<Gate Terminal Portion>>

FIG. 9 presents a connection structure from the scanning signal line GL of the display matrix to its external connection terminal GTM, and (A) is a top plan view whereas (B) is a section taken along line B-B of (A). Incidentally, FIG. 9 corresponds to the lower portion of FIG. 18, and the hatched line portions are shown by straight lines for conveniences.

Letters AO designate a photolithographic mask pattern, namely, a photo resist pattern for selective anodization. As a result, this photo resist is anodized and then removed so that the shown pattern AO is not left as a complete but as a trace because the oxide film AOF is selectively formed in the gate line GL, as shown in section. With reference to the boundary line AO of the photo resist in the top plan view, the lefthand side is the region which is covered with the resist and is not anodized, whereas the righthand side is the region which is exposed from the resist to the outside and is anodized. The anodized Al layer g2 has its surface formed with its oxide $Al_2O_3$ film AOF and its lower conductive portion reduced in volume. Of course, the anodization is so carried out for a proper time and at a proper voltage that the conductive portion may be left. The mask pattern AO is made to intersect the scanning line GL not in a straight line but in a folded crank shape.

The Al layer g2, as shown, is hatched for easy understanding, but the region left non-anodized is patterned in a comb shape. This is intended to suppress the probability of the line breakage and the sacrifice of the conductivity to the minimum while preventing any formation of whiskers by narrowing the width of each Al layer and bundling a plurality of them in parallel, because the whisker will occur in the surface for the wide Al layers. In the present embodiment, therefore, the portion corresponding to the root of the comb is displaced along the mask AO.

The gate terminal GTM is formed of: a Cr layer g1 having an excellent contact with the silicon oxide SiO layer and a higher resistance to galvanic corrosion than Al or the like; and the transparent conductive layer d1 protecting the surface of the Cr layer g1 and having the same level (belonging to the same layer and formed simultaneously) as the pixel electrode ITO1. Incidentally, the conductive layers d2 and d3 formed over and on the sides of the gate insulating film GI are left as a result that the conductive layers g2 and g1 are covered with the photo resist so that they may not be etched off by pin holes or the like at the time of etching the conductive layers d3 and d2. Moreover, the ITO layer d1 extended rightward across the gate insulating film GI is provided for further completing the similar countermeasures.

In the top plan view, the gate insulating film GI is formed at the more righthand side than its boundary, and a passivation film PSV1 is also formed at the more righthand side than the boundary so that the terminal portion GTM at the lefthand side can be exposed from them into electric contact with the external circuits. Although only one pair of the gate line GL and the gate terminal is shown, a plurality of pairs are arranged vertically in FIG. 18, as a matter of fact, to constitute the terminal group Tg (as shown in FIGS. 17 and 18), and the gate terminals have their lefthand ends are extended in the fabrication process across the cut region CT1 of the substrate and are short-circuited by a line SHg. This short-circuiting line SHg in the fabrication process is useful for supplying the electric power at the anodizing time and for preventing the electrostatic breakdown at the time of rubbing the orientation film ORI1.

<<Drain Terminal DTM>>

Figures 10A, 10B:
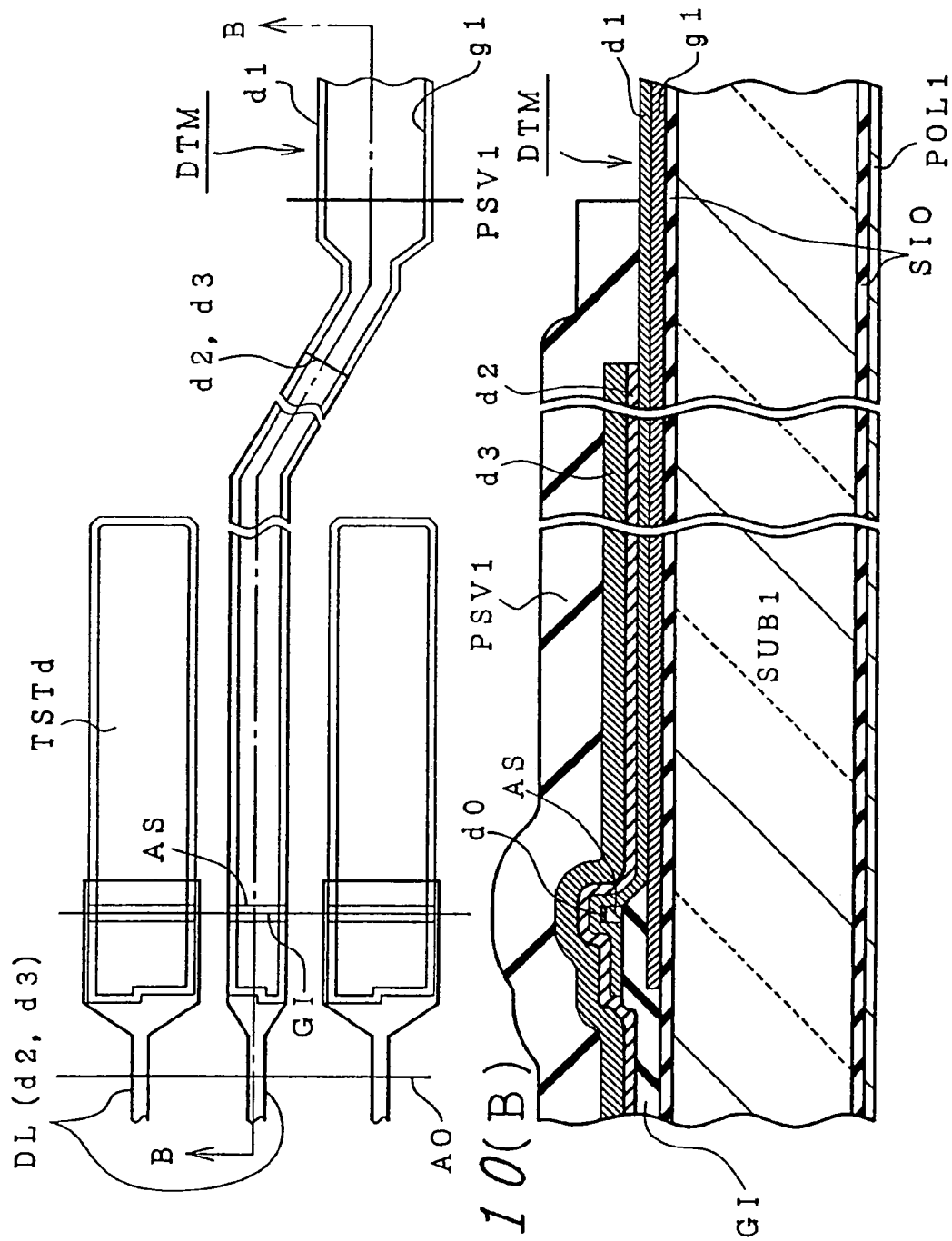
FIG. 10 presents a top plan view and a section showing the vicinity of a connecting portion between a drain terminal DTM and a video signal line DL.

FIG. 10 is a diagram showing the connection from the video signal line DL to its external connection terminal DTM, and (A) presents a top plan view whereas (B) presents a section taken along line B-B of (A). Incidentally, FIG. 10 corresponds to the upper righthand portion of FIG. 18 and has its righthand direction corresponding to the upper end portion (or the lower end portion) of the substrate SUB1, although the direction of the drawing is changed for conveniences.

Letters TSTd designate a test terminal which is not connected with any external terminal but widened to contact with a probe or the like. Likewise, the drain terminal DTM is also made wider than the wiring portion as to connected with the external terminal. The test terminal TSTd and the external connection drain terminal DTM are so alternately arrayed in plurality as to be vertically staggered so that the test terminal TSTd terminates without reaching the end portion of the substrate SUB1, as shown. But, the drain terminals DTM constitute the terminal group Td (whose suffix is omitted), as shown in FIG. 18, and are further extended across the cut line CT1 of the substrate SUB1 so that all of them are short-circuited to each other through lines SHd so as to prevent any electrostatic breakdown during the fabrication step. The drain connection terminals are connected to the opposite sides of the video signal lines DL, in which the test terminal TSTd are present, across the matrix, whereas the test terminals are connected to the opposite sides of the video signal lines DL, in which the drain connection terminals DTM are present, across the matrix.

By a reason similar to the gate terminal GTM, the drain connection terminal DTM is formed of two layers, i.e., the Cr layer g1 and the ITO layer d1 and is connected with the video signal line DL through the portion, from which is removed the gate insulating film GI. The semiconductor layer AS formed over the end portion of the gate insulating film GI is provided for etching the edge of the gate insulating film GI in a taper shape. For connection with an external circuit, the passivation film PSV1 is naturally removed from the terminal DTM. Letters AO designate the aforementioned anodizing mask which has its boundary formed to enclose the entirety of the matrix. As shown, the lefthand side is covered with the mask, but the remaining uncovered portion has no layer g2 so that it has no relation to the pattern.

The leading lines from the matrix portion to the drain terminal portion DTM are constructed, as shown at (C) in FIG. 19, such that the layers d2 and d3 at the same level as the video signal lines DL are laminated midway of the seal pattern SL just over the layers d1 and g1 at the same level as the drain terminal portion DTM. This construction is intended to minimize the probability of breakage of lines thereby to protect the galvanically corrosive Al layer as much as possible with the passivation film PSV1 and the seal pattern SL.

<<Structure of Latching Capacitor Cadd>>

The transparent pixel electrode ITO1 is formed to overlap the adjoining scanning signal line GL at the end opposed to the end to be connected with the thin thin film transistor TFT. This superposition constitutes a latching capacity element (or an electrostatic capacity element) Cadd which uses the transparent pixel electrode ITO as its one electrode PL2 and the adjoining scanning signal line GL as its other electrode PL1, as is apparent from FIGS. 1 and 3. This latching capacity element Cadd has its dielectric films formed of: the insulating film GI used as the gate insulating film of the thin film transistor TFT; and the anodized film AOF.

The latching capacitor Cadd is formed in the widened portion of the second conductive layer g2 of the scanning gate line GL, as is apparent from FIG. 5. Here, the second conductive film g2 at the portion intersecting the video signal line DL is thinned to reduce the probability of the short-circuiting with the video signal line DL.

Even if the transparent pixel electrode ITO1 is broken at the stepped portion of the electrode PL1 of the latching capacitor Cadd, its defect is compensated by the island region which is constructed of the second conductive film d2 and the third conductive film d3 formed across that step.

<<Equivalent Circuit of Whole Display Circuit>>

Figure 11:
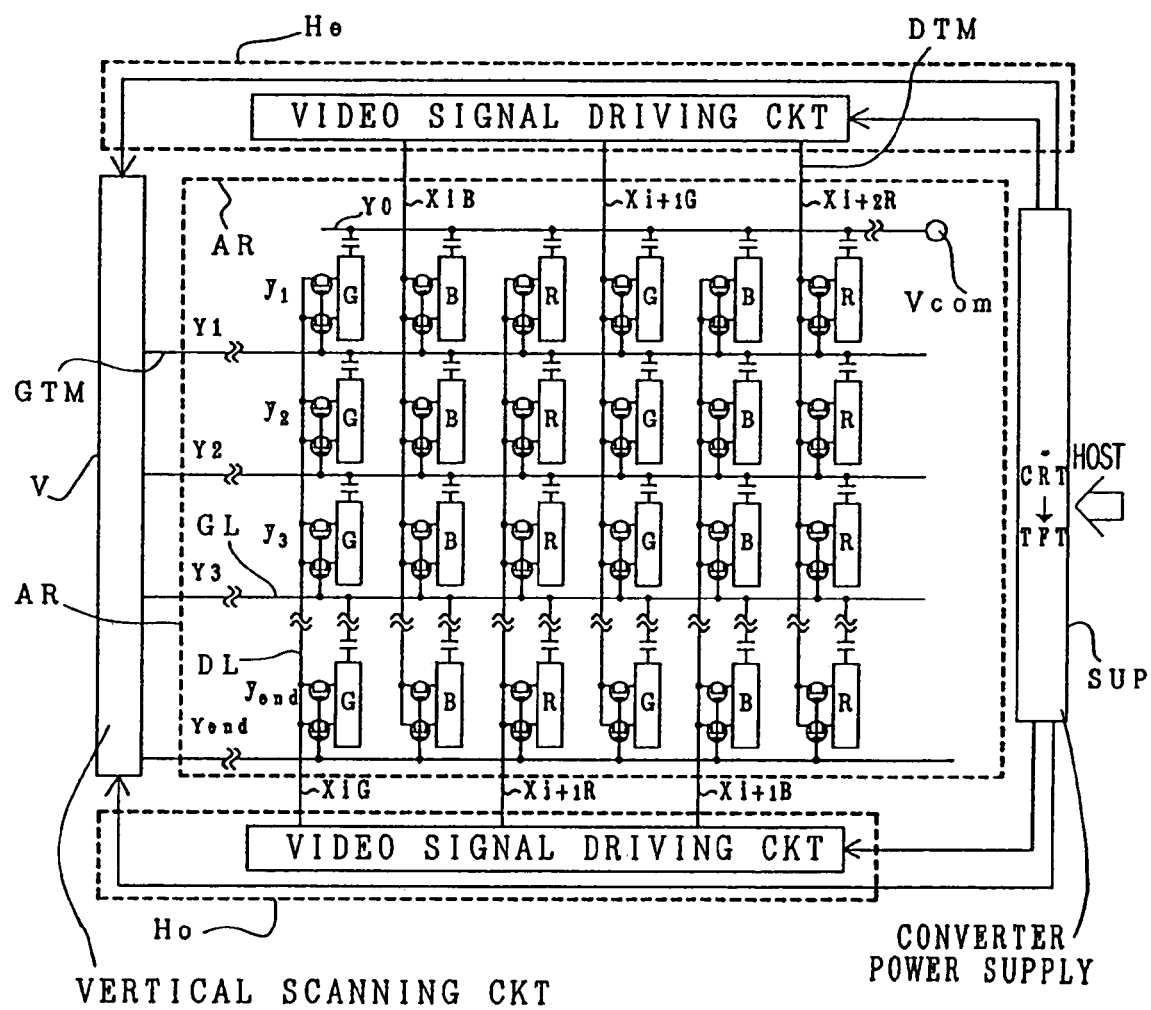
FIG. 11 is an equivalent circuit diagram showing a liquid crystal display circuit of a color liquid crystal display device of active matrix type.

FIG. 11 shows an equivalent circuit diagram of the display matrix portion and a wiring diagram of its peripheral circuits. Although this drawing is a circuit diagram, it is depicted in a manner to correspond to a practical geometric disposition. Letters AR designate a matrix array formed by disposing a plurality of pixels two-dimensionally.

In the drawing, letter X designates the video signal line, and suffixes G, B and R are added to correspond to green blue and red pixels, respectively. Letter Y designates the scanning signal line GL, and suffixes 1, 2, 3, - - - , and so on are added in accordance with the sequence of the scanning timing.

The video signal line X (whose suffix is omitted) is alternately connected with the upper (or odd-numbered) video signal driving circuit He and with the lower (or even-numbered) video signal driving circuit Ho.

The scanning signal line Y (whose suffix is omitted) is connected with a vertical scanning circuit V.

Letters SUP designate a circuit which includes a power supply circuit for obtaining a plurality of divided and stabilized voltage sources from one voltage source, and a circuit for converting data for CRT (i.e., Cathode Ray Tube) from a host (i.e., a higher-order operational processor) to data for the TFT liquid crystal display device.

<<Equivalent Circuit of Latching Capacitor Cadd and its Operations>>

Figure 12:
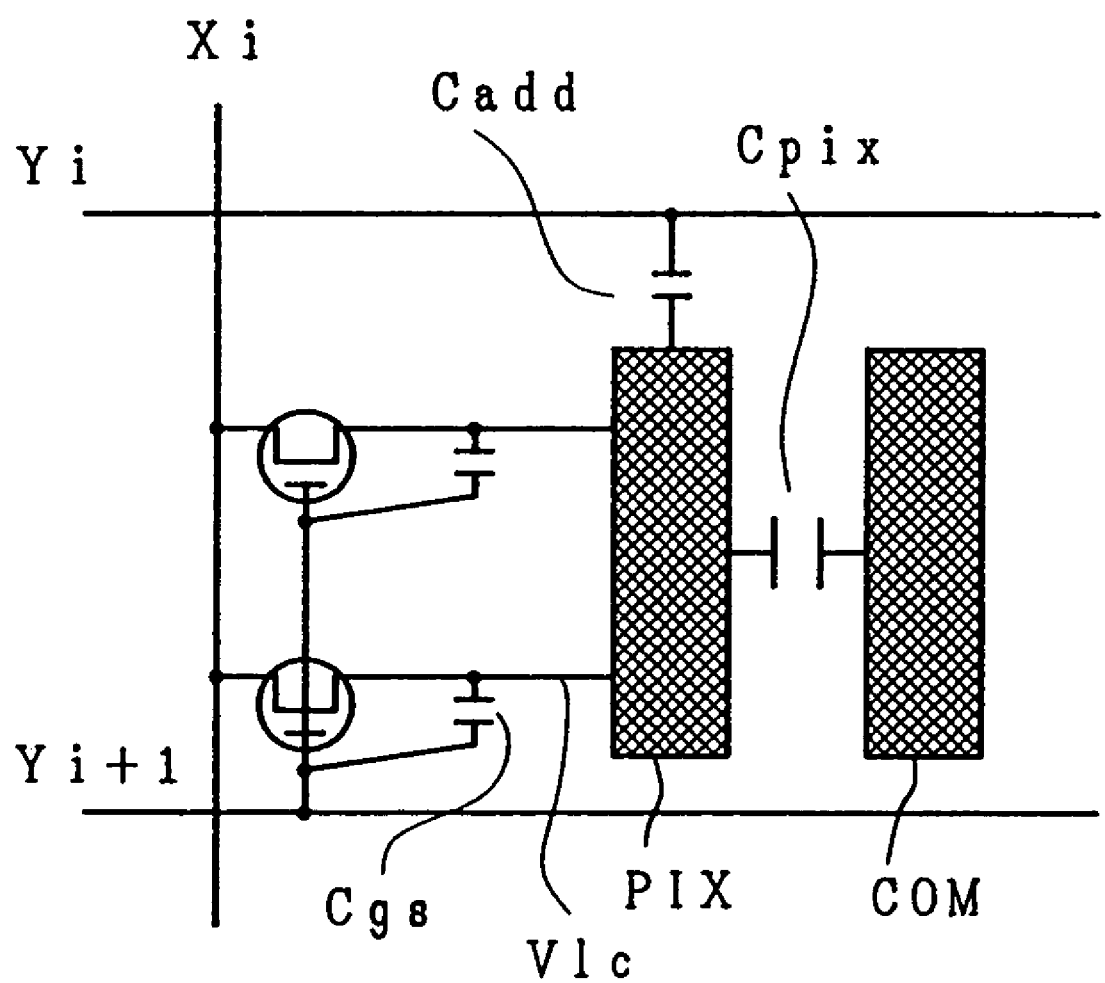
FIG. 12 is an equivalent circuit diagram showing the pixel shown in FIG. 1.

The equivalent circuit of the pixel shown in FIG. 1 is shown in FIG. 12. In FIG. 12, letters Cgs designate a parasitic capacitor to be formed between the gate electrode GT and the source electrode SD1 of the thin film transistor TFT. The parasitic capacitor Cgs has its dielectric film made of the insulating film GT and the anodized oxide film AOF. Letters Cpix designate a liquid crystal capacitor to be formed between the transparent pixel electrode ITO1 (or PIX) and the common transparent pixel electrode ITO2 (or COM). The dielectric film of the liquid crystal capacitor Cpix is formed of the liquid crystal LC< the passivation film PSV1 and the alignment films ORI1 and ORI2. Letters V1c designate a mid point potential.

The latching capacity element Cadd functions to reduce the influences of the gate potential variation delta Vg upon the center potential (e.g., the pixel electrode potential) V1c when the thin film transistor TFT switches, as expressed by the following formula:

delta $V1c = \{Cgs/(Cgs+Cadd+Cpix)\} \times delta Vg$, wherein delta V1c indicates the variation of the central potential due to delta Vg. This variation delta V1c causes the DC component to be added to the liquid crystal LC and can be reduced the more for the higher latching capacitor Cadd. Moreover, the latching capacitor Cadd functions to elongate the discharge time and stores the video information for a long time after the thin film transistor TFT is turned off. The DC component to be applied to the liquid crystal LC can improve the lifetime of the liquid crystal LC, to reduce the so-called "printing", by which the preceding image is left at the time of switching the liquid crystal display frame.

Since the gate electrode GT is enlarged to such an extent as to cover the semiconductor layer AS completely, as has been described hereinbefore, the overlapped area with the source electrode SD1 and the drain electrode SD2 is increased to cause an adverse effect that the parasitic capacity Cgs is increased to make the center potential V1c liable to be influenced by the gate (scanning) signal Vg. However, this demerit can be eliminated by providing the latching capacitor Cadd.

The latching capacity of the latching capacitor Cadd is set from the pixel writing characteristics to a level four to eight times as large as that of the liquid crystal capacity Cpix (4*Cpix<Cadd<8*Cpix) and eight to thirty two times as large as that of the capacity Cgs (8*Cgs<Cadd<32*Cgs).

<<Method of Connecting Electrode Line of Latching Capacitor Cadd>>

The initial stage scanning signal line GL (i.e., $Y_0$) to be used only as the capacity electrode line is set to the same potential as that of the common transparent pixel electrode (Vcom) ITO2, as shown in FIG. 11. In the example of FIG. 18, the initial stage scanning signal line is short-circuited to the common electrode COM through the terminal GTO, the leading line INT, a terminal DTO and an external line. Alternatively, the initial stage latching capacity electrode line $Y_0$ may be connected with the final stage scanning signal line Yend or a DC potential point (or AC ground point) other than the Vcom, or connected to receive one excess scanning pulse $Y_0$ from the vertical scanning circuit V.

<<Structure for Connection with External Circuit>>

Figure 22:
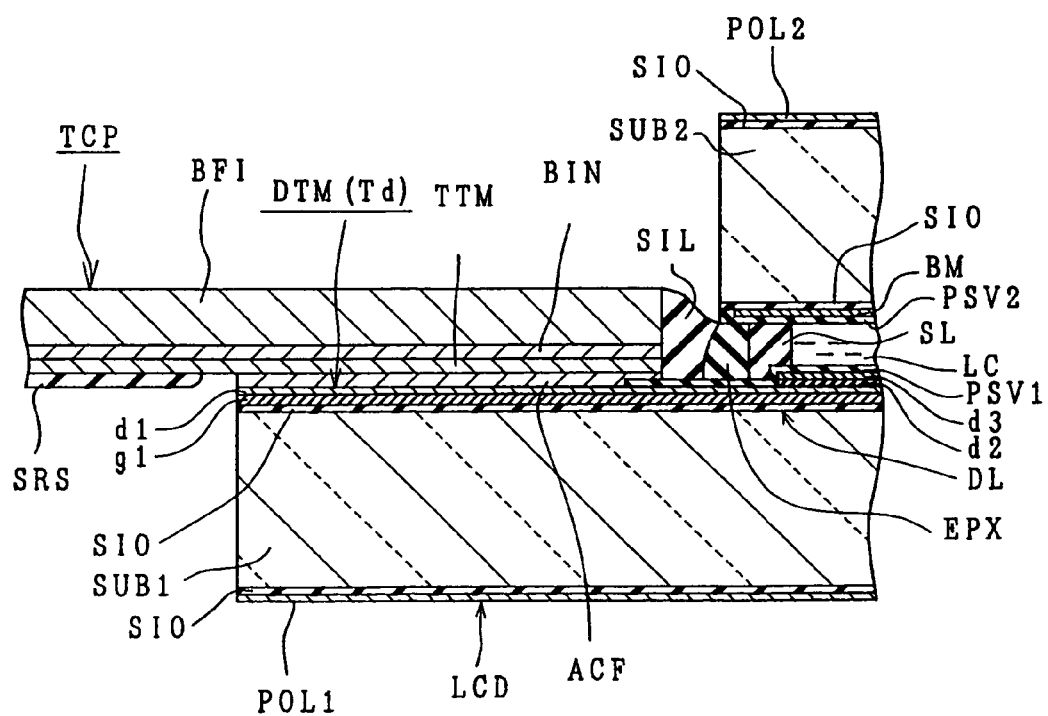
FIG. 22 is a section showing the state of an essential portion, in which the tape carrier package TCP is connected with a video signal circuit terminal DTP of a liquid crystal display panel PNL.

FIG. 21 is a diagram showing a sectional structure of the tape carrier package TCP, in which the integrated circuit chip CHI is mounted on the flexible wiring substrate (as called "TAB": Tape Automated Bonding), to construct the scanning signal driving circuit V or the video signal driving circuits He and Ho. FIG. 22 is a section showing the state of an essential portion, in which the tape carrier package TCP is connected in the present example with the video signal circuit terminal DTM.

In the same drawing, letters TTB designate an input terminal/wiring portion of the integrated circuit CHI, and letters TTM designate an output terminal/wiring portion of the integrated circuit CHI. These portions are made of Cu, for example, and have their individual inner leading end portions (as called the "inner leads") connected with a bonding pad PAD of the integrated circuit CHI by the so-called "faced-down bonding method". The terminals TTB and TTM have their outer leading end portions (as called the "outer leads") corresponding to the input and output of the semiconductor integrated circuit chip CHI, respectively, and are connected with the CRT/TFT converter circuit and the power supply circuit SUP by the soldering method and with the liquid crystal display panel PNL through an anisotropic conductive film ACF. The package TCP is so connected with the panel that its leading end portion covers the passivation film PSV1 having the connection terminal DTM exposed at the side of the panel PNL. As a result, the external connection terminal DTM (GTM) is strong against the galvanic corrosion because it is covered with at least one of the passivation film PSV1 or the package TCP.

Letters BF1 designate a base film made of polyimide or the like, and letters SRS designate a solder resist film for masking to prevent the solder from leaking to an unnecessary portion at the soldering time. The gap between the upper and lower glass substrates outside of the seal pattern SL is protected after the rinsing step by the epoxy resin EPX or the like, and this protection is multiplexed by filling a silicone resin SIL between the package TCP and the upper substrate SUB2.

<<Manufacturing Process>>

Next, a process for manufacturing the side of the substrate SUB1 of the aforementioned liquid crystal display device will be described with reference to FIGS. 13 to 15. In these Figures, the central letters indicate the abbreviations of the step names, and the lefthand sides show the pixel portions shown in FIG. 2 whereas the righthand sides show the process flow, as viewed in section from the vicinity of the gate terminals shown in FIG. 9. Steps A to I excepting Step D are divided to correspond to the individual photolithographic steps, and any sections of the individual steps indicate the steps, at which the photo resists are removed after the photolithographic treatments. Incidentally, these photolithographic treatments are intended in the present description to imply a series of operations from the application of a photo resist to the development through a selective exposure using a mask, and their repeated description will be omitted. The description will be made in accordance with the steps divided, as follows.

Figure 13:
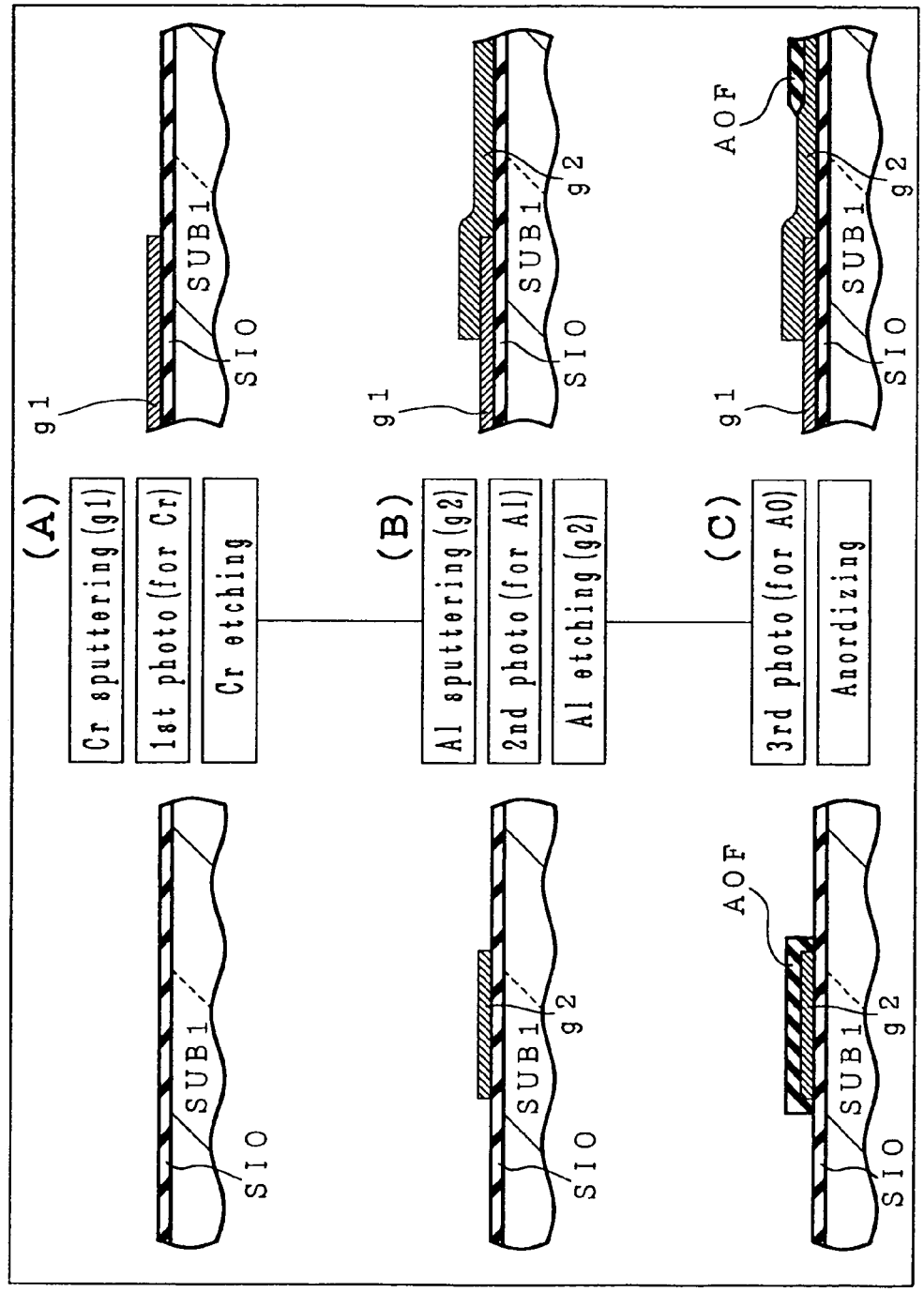
FIG. 13 presents a flow chart of sections of a pixel portion and a gate terminal portion and shows C the fabrication steps A to C at the side of a substrate SUB1.

Step A, FIG. 13

A silicon dioxide film SIO is deposited by the dip treatment on both surfaces of a lower transparent glass substrate SUB1 made of 7059 glass (under the trade name), and then a baking is carried out at 500 degree for 60 minutes. A first conductive film g1 consisting of a 1,100 angstrom-thick chromium film is deposited on the lower transparent glass substrate SUB1 by the sputtering. After the photolithographic treatment, the first conductive film g1 is etched selectively by the photoetching using a ceric ammonium nitrate solution as an etching solution, thereby forming a gate terminal GTM and a drain terminal DTM and forming also a power bus line SMg for anodization for connecting the gate terminal GTM, and a pad (although not shown) connected with the power bus line SHg for anodization.

Step B, FIG. 13

A second conductive film g2 having a thickness of 2,800 angstroms and made of Al—Pd, Al—Si, Al—Si—Ti or Al—Si—Cu is formed by the sputtering. After the photolithographic treatment, the second conductive film g2 is selectively etched with a mixed acid solution of phosphoric acid, nitric acid and glacial acetic acid.

Step C, FIG. 13

After the photolithographic treatment (i.e., after the formation of the aforementioned anodized mask AO), the substrate SUB1 is dipped in the anodizing liquid which is prepared by diluting a solution containing 3% of tartaric acid adjusted to PH 6.2 to 6.3 with a solution of ethylene glycol, and the anodizing current density is adjusted to 0.5 mA/cm$^2$ (for anodization at a constant current). Next, an anodization is carried out till an anodization current of 125 V necessary for a predetermined $Al_2O_3$ film thickness is reached. After this, the substrate SUB1 is desirably held in this state for several ten minutes (for anodization at a constant voltage). This is important for achieving a uniform $Al_2O_3$ film. Thus, the conductive film g2 is anodized to form an anodized film AOF having a thickness of 1,800 angstroms over the scanning signal line GL, the gate electrode GT and the electrode PL1.

Figure 14:
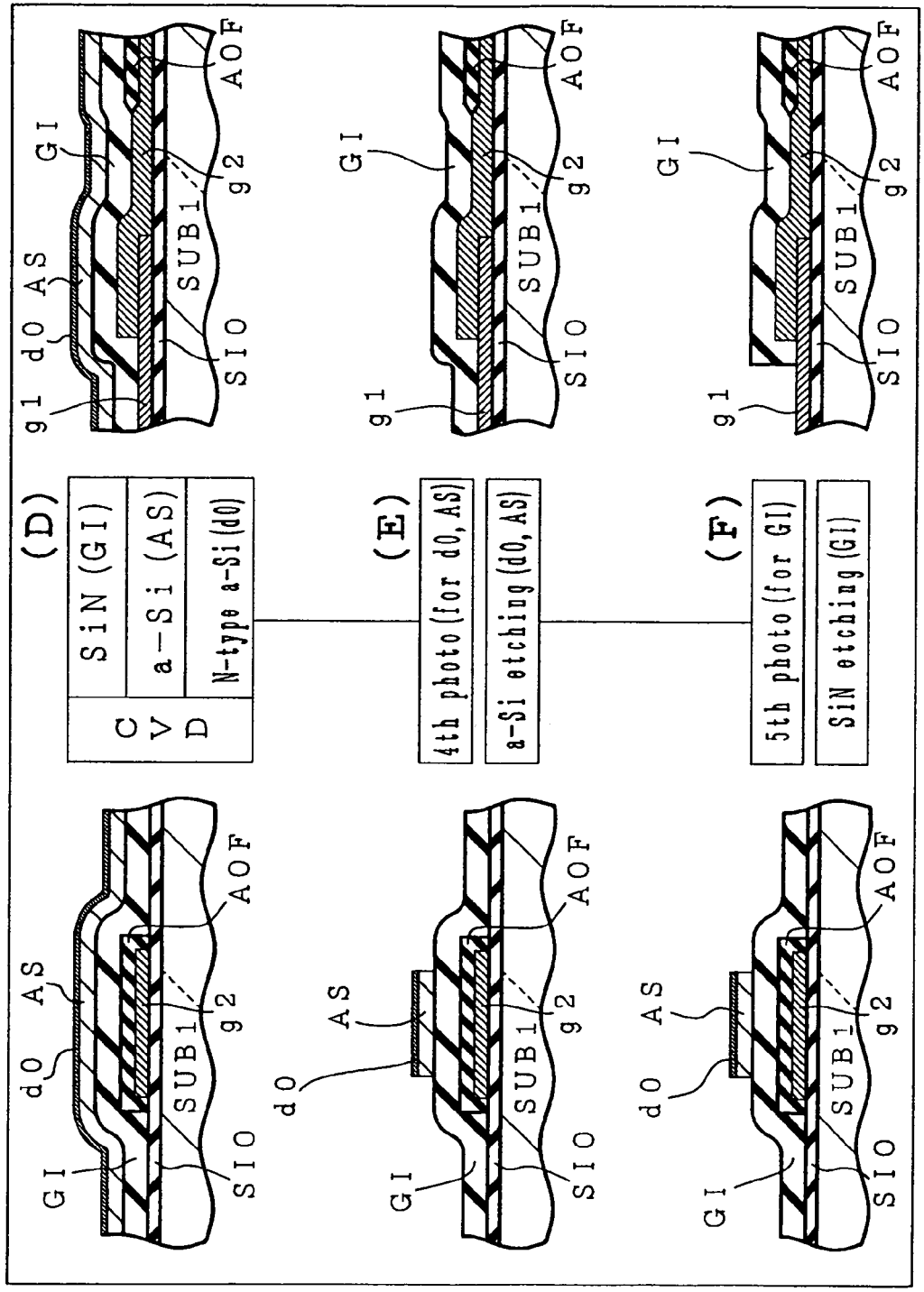
FIG. 14 presents a flow chart of sections of the pixel portion and the gate terminal portion and shows the fabrication steps D to F at the side of the substrate SUB1.

Step D, FIG. 14

Ammonia gas, silane gas and nitrogen gas are introduced into a plasma CVD apparatus to form a Si nitride film having a thickness of 2,000 angstroms, and silane gas and hydrogen gas are introduced into the plasma CVD apparatus to form an i-type amorphous Si film having a thickness of 2,000 angstroms. After this, hydrogen gas and phosphine gas are introduced into the plasma CVD apparatus to form an N(+)-type amorphous Si film having a thickness of 300 angstroms.

Step E, FIG. 14

After the photolithography, the N(+)-type amorphous Si film and the i-type amorphous Si film are selectively etched by the photoetching using $SF_6$ and $CCl_4$ as the dry etching gas to form an island of an i-type semiconductor layer AS.

Step F, FIG. 14

After the photolithography, the Si nitride film is selectively etched by using $SF_6$ as the dry etching gas.

Figure 15:
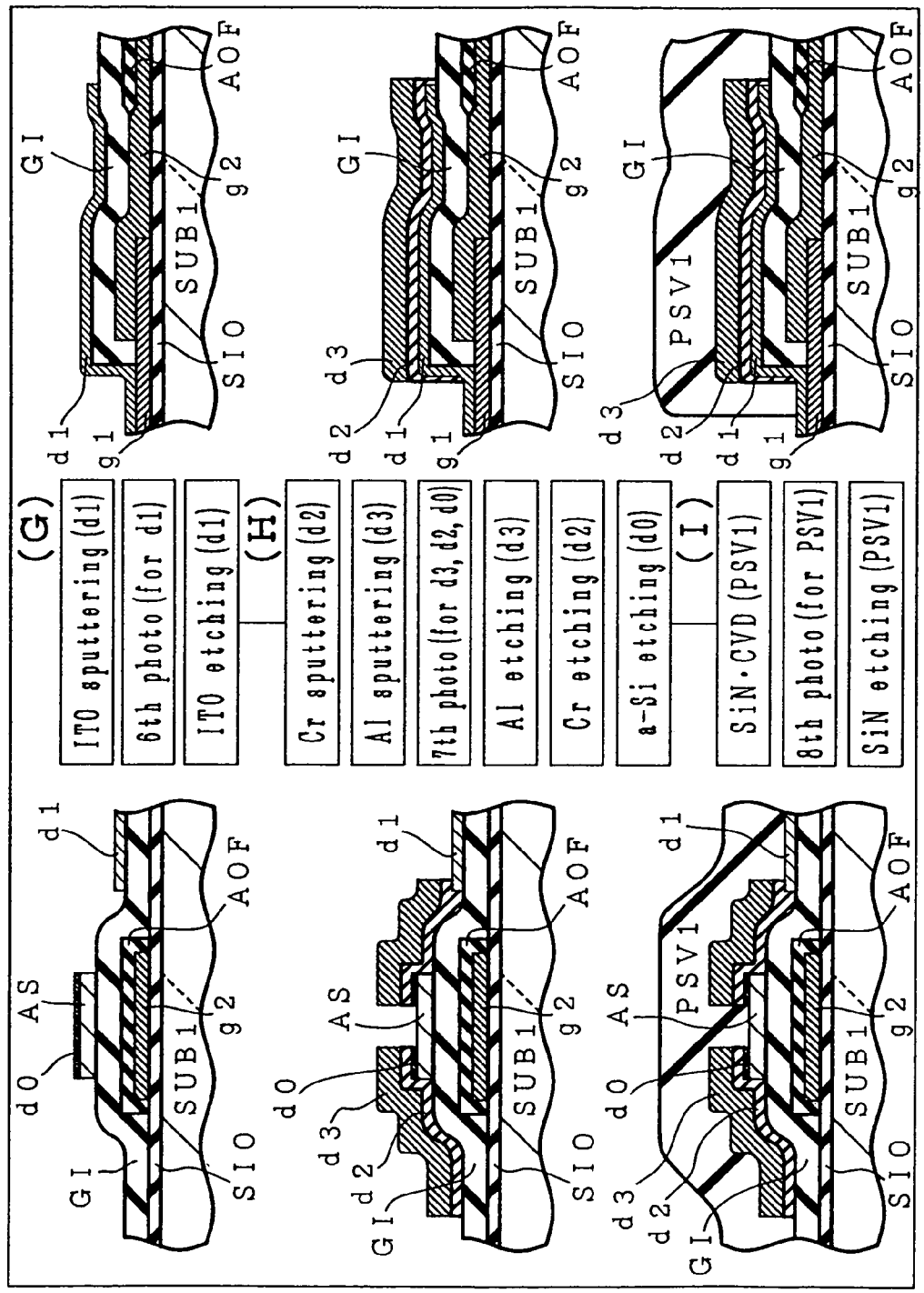
FIG. 15 presents a flow chart of sections of the pixel portion and the gate terminal portion and shows the fabrication steps G to I at the side of the substrate SUB1.

Step G, FIG. 15

A first conductive film d1 formed of an ITO film having a thickness of 1,400 angstroms is formed by the sputtering. After the photolithography, the first conductive film d1 is selectively etched by using a mixed acid solution of hydrochloric acid and nitric acid as the etching solution, to form the uppermost layer of the gate electrode GTM and the drain terminal DTM and the transparent pixel electrode ITO1.

Step H, FIG. 15 A second conductive film d2 of Cr having a thickness of 600 angstroms is formed by the sputtering, and a third conductive film d3 of Al—Pd, Al—Si, Al—Si—Ti or Al—Si—Cu having a thickness of 4,000 angstroms is formed by the sputtering. After the photolithography, the third conductive film d3 is etched by a solution similar to that of Step B, and the second conductive film d2 is etched by a solution similar to that of Step A, to form the video signal line DL, the source electrode SD1 and the drain electrode SD2. Next, $CCl_4$ and $SF_6$ are introduced into a dry etching apparatus to etch the N(+)-type amorphous Si film thereby to remove the N(+)-type semiconductor layer d0 selectively from between the source and the drain.

Step I, FIG. 15

Ammonia gas, silane gas and nitrogen gas are introduced into a plasma CVD apparatus to form a Si nitride film having a thickness of 1 micron. After the photolithography, the Si nitride film is selected by the photoetching technique using $SF_6$ as the dry etching gas, to form the passivation film PSV1.

<<Structure of Whole Liquid Crystal Display Module>>

Figure 23:
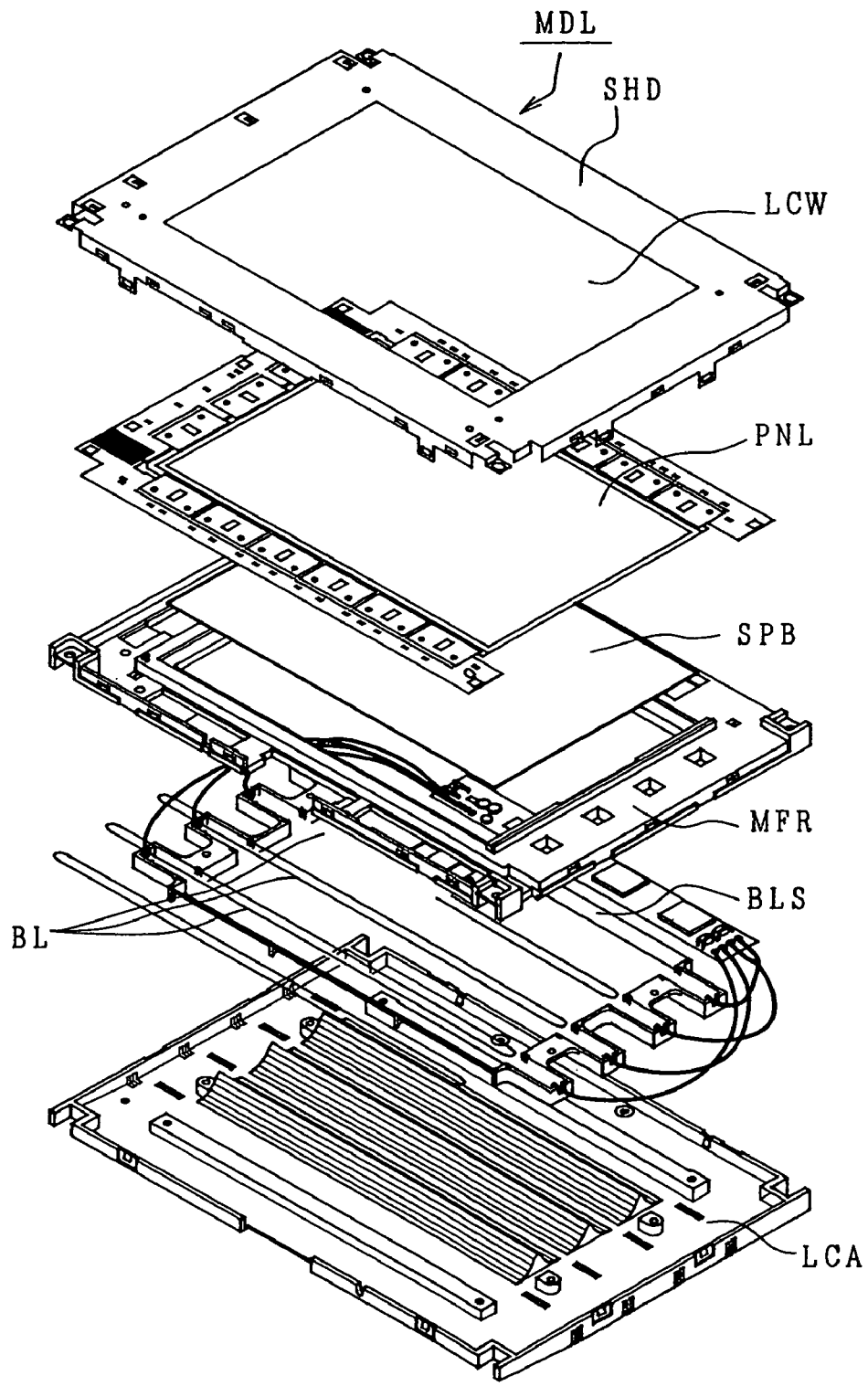
FIG. 23 is an exploded perspective view showing a liquid crystal display module.

FIG. 23 is an exploded perspective view showing a liquid crystal display module MDL, and the specific construction of the individual components is shown in FIGS. 24 to 39.

Letters SHD designate a shield casing (=metal frame) made of a metal plate; letters LCW designate a liquid crystal display window; letters PNL designate a liquid crystal display panel; letters SPB designate an optical diffusion plate; letters MFR designate a middle frame; letters BL designate back lights; letters BLS designate a back light support; and letters LCA designate a lower casing. All of these members are stacked in vertical positions, as shown, to assemble a module MDL.

The module MDL is constructed of three kinds of holding members: the lower casing LCA, the middle frame MFR, and the shield casing SHD. These three members are individually formed generally into box shapes and are stacked in the recited order to hold the remaining two members mounting the individual parts by the shield casing SHD. The display panel PNL and the optical diffusion board SPB can be once placed on the middle frame MFR, and the back light support BLS supporting the four back lights (or cold-cathode fluorescent lamps) can be once placed on the lower casing LCA. As a result, the two members, i.e., the lower casing LCA and the middle frame MFR can be stacked without any upside-down while packaging the necessary parts, so that the manufacture can be facilitated to provide a device having an excellent assembly and a high reliability, This advantage is one of the major features of the present module.

The individual members will be described in more detail in the following.

<<Shield Casing SHD>>

Figure 24:
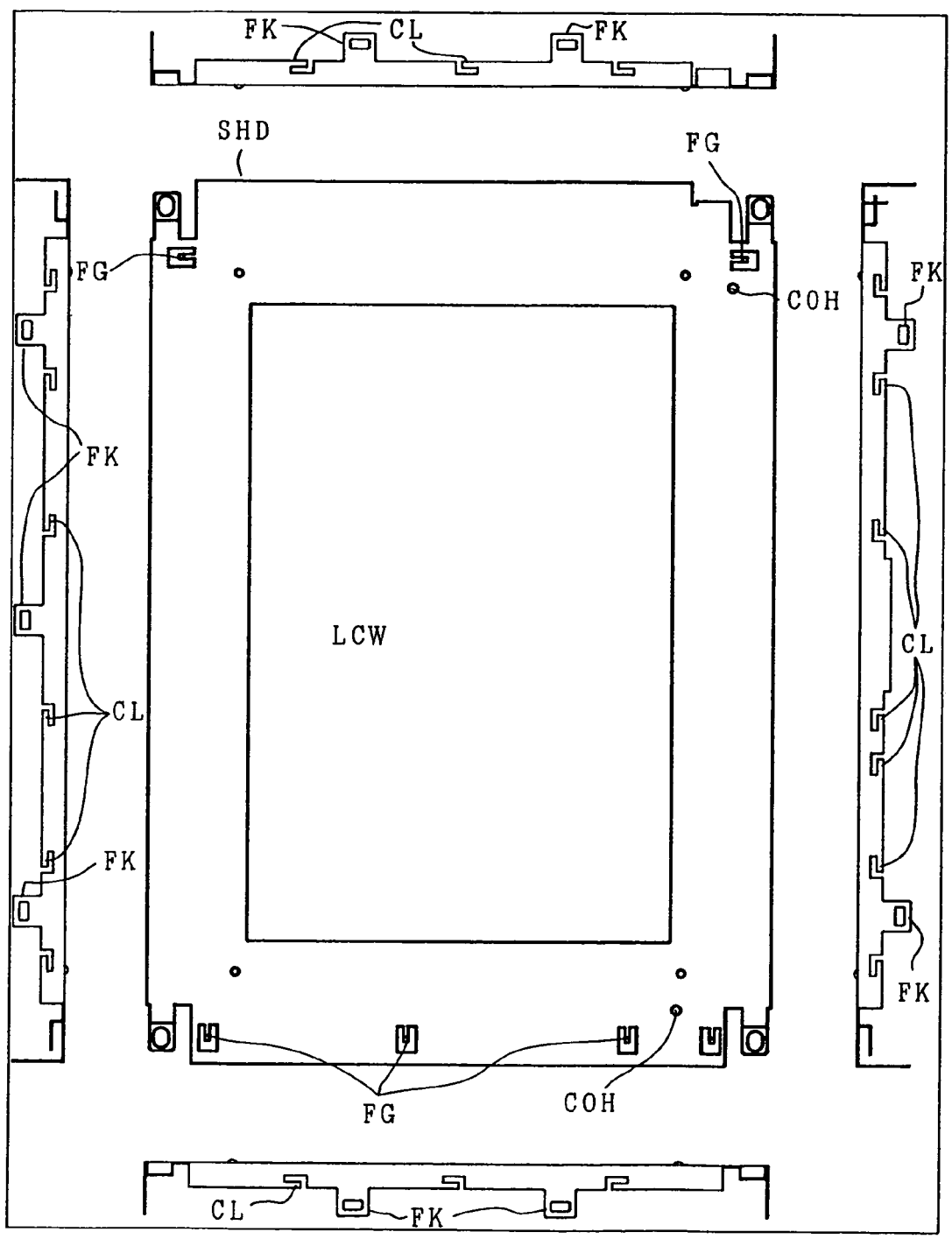
FIG. 24 presents upper side, front side, rear side, righthand side and lefthand side views of a shield casing of the liquid crystal display module.
Figure 25:
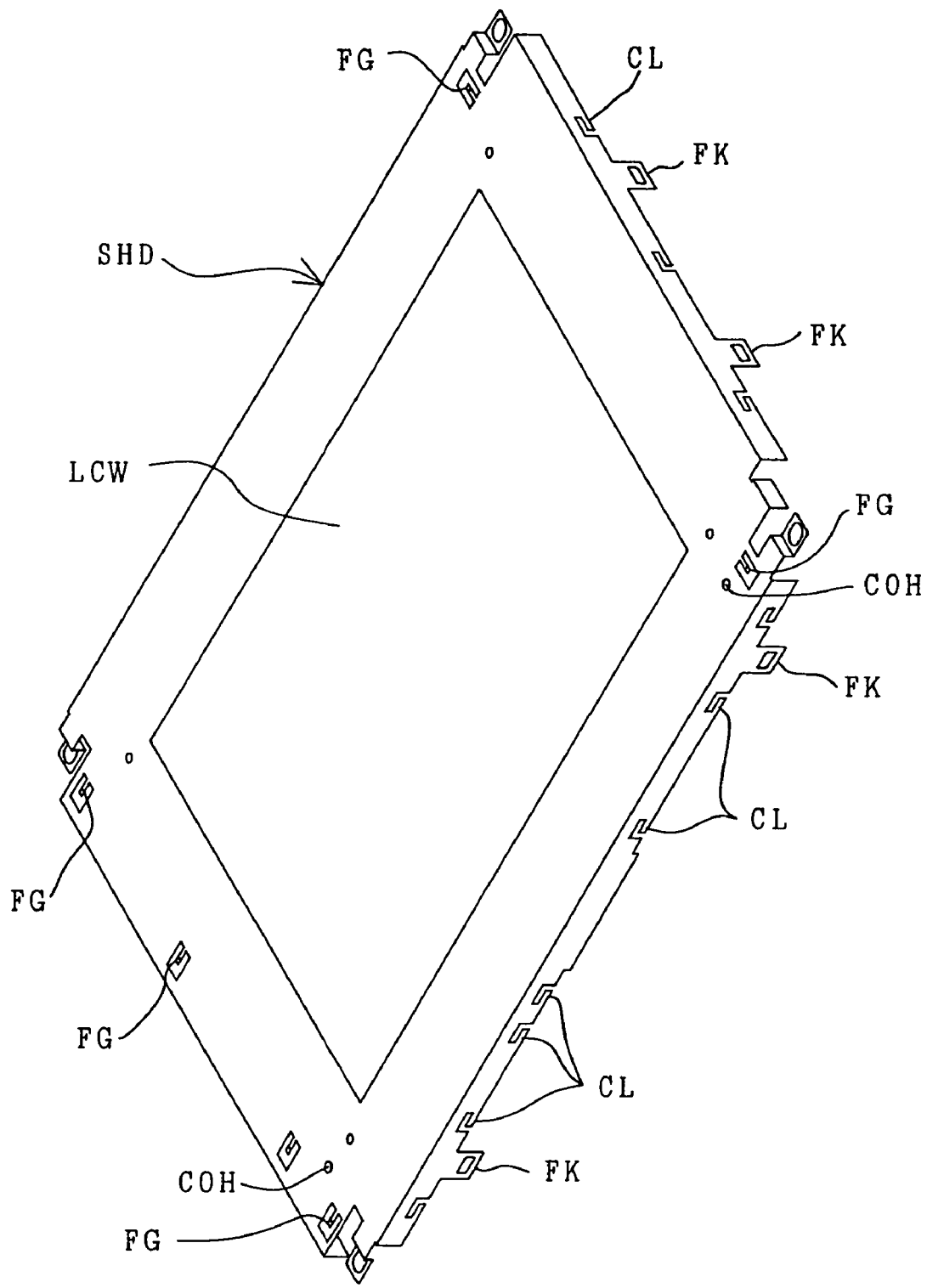
FIG. 25 is a perspective view showing the shield casing and taken from the upper side.

FIG. 24 presents the upper side, front side, rear side, righthand side and lefthand side of the shield casing SHD, and FIG. 25 is a perspective view showing the shield casing SHD obliquely downward.

The shield, casing (or metal frame) SHD is fabricated by punching or folding a metal sheet by the pressing technique. Letters LCW designate a window for exposing the display panel PNL to the field of view, as will be called the "display window".

Figure 34:
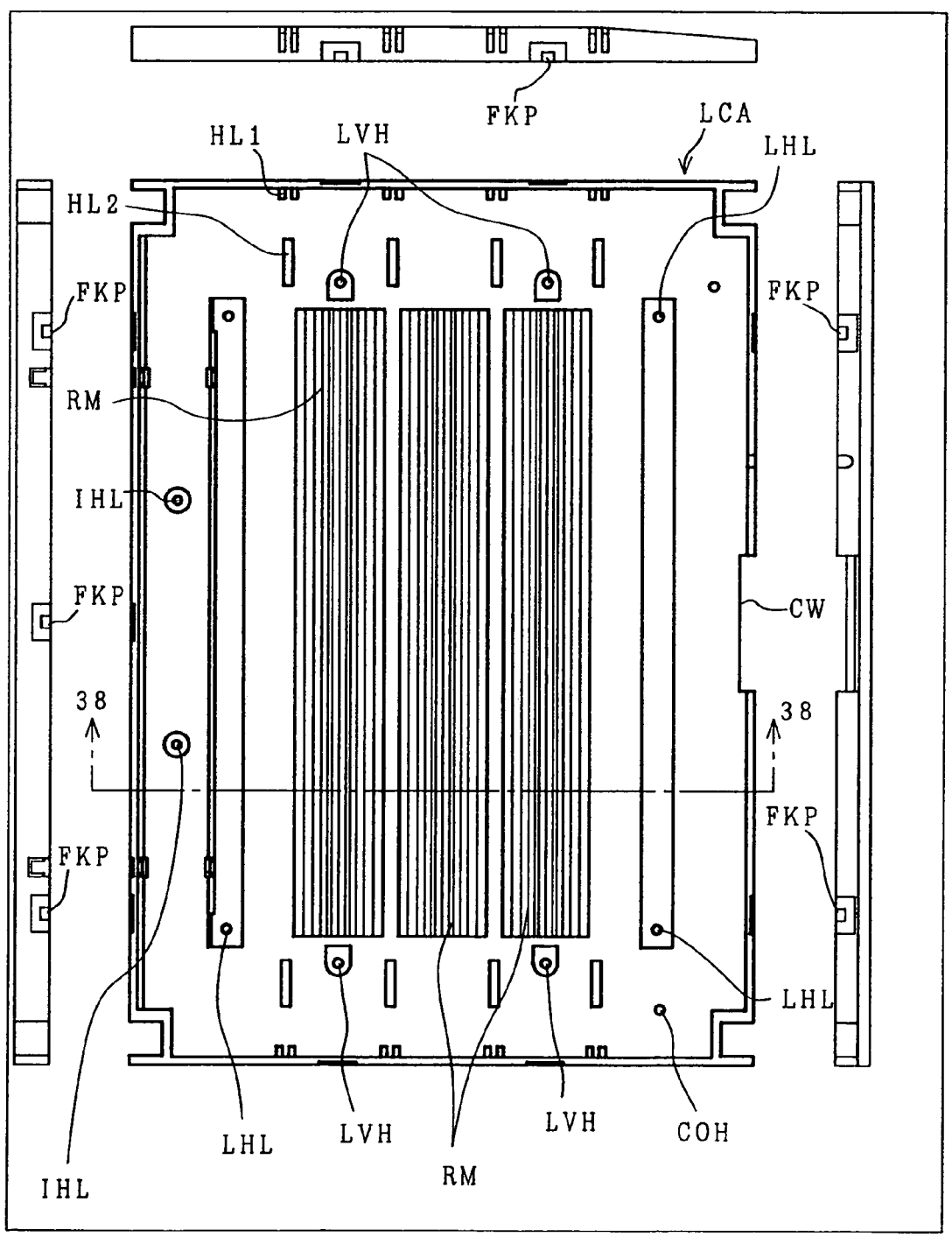
FIG. 34 presents upper side (or reflection side), rear side, righthand side and lefthand side of a lower casing.
Figure 35:
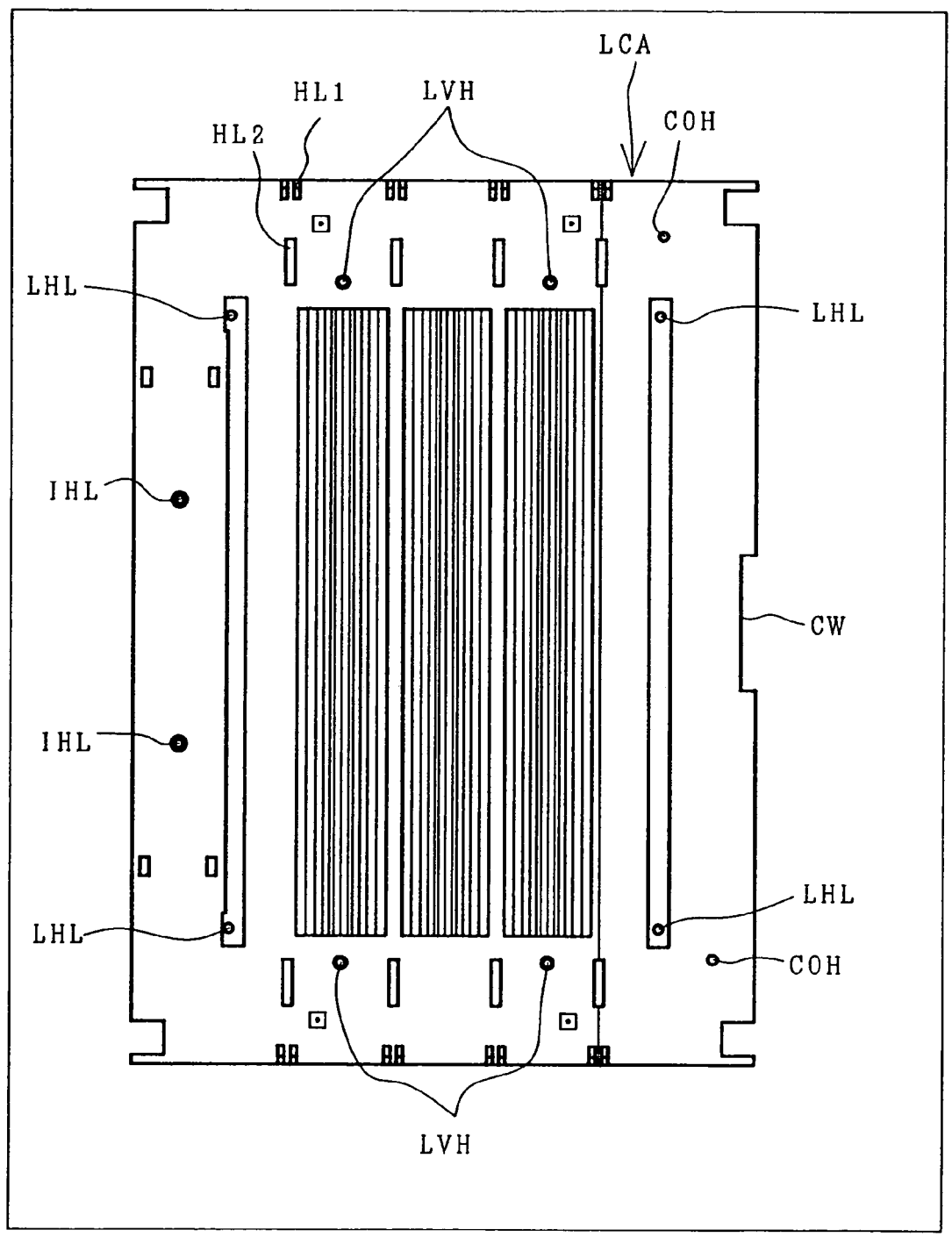
FIG. 35 is a lower side view of the lower casing.
Figure 36:
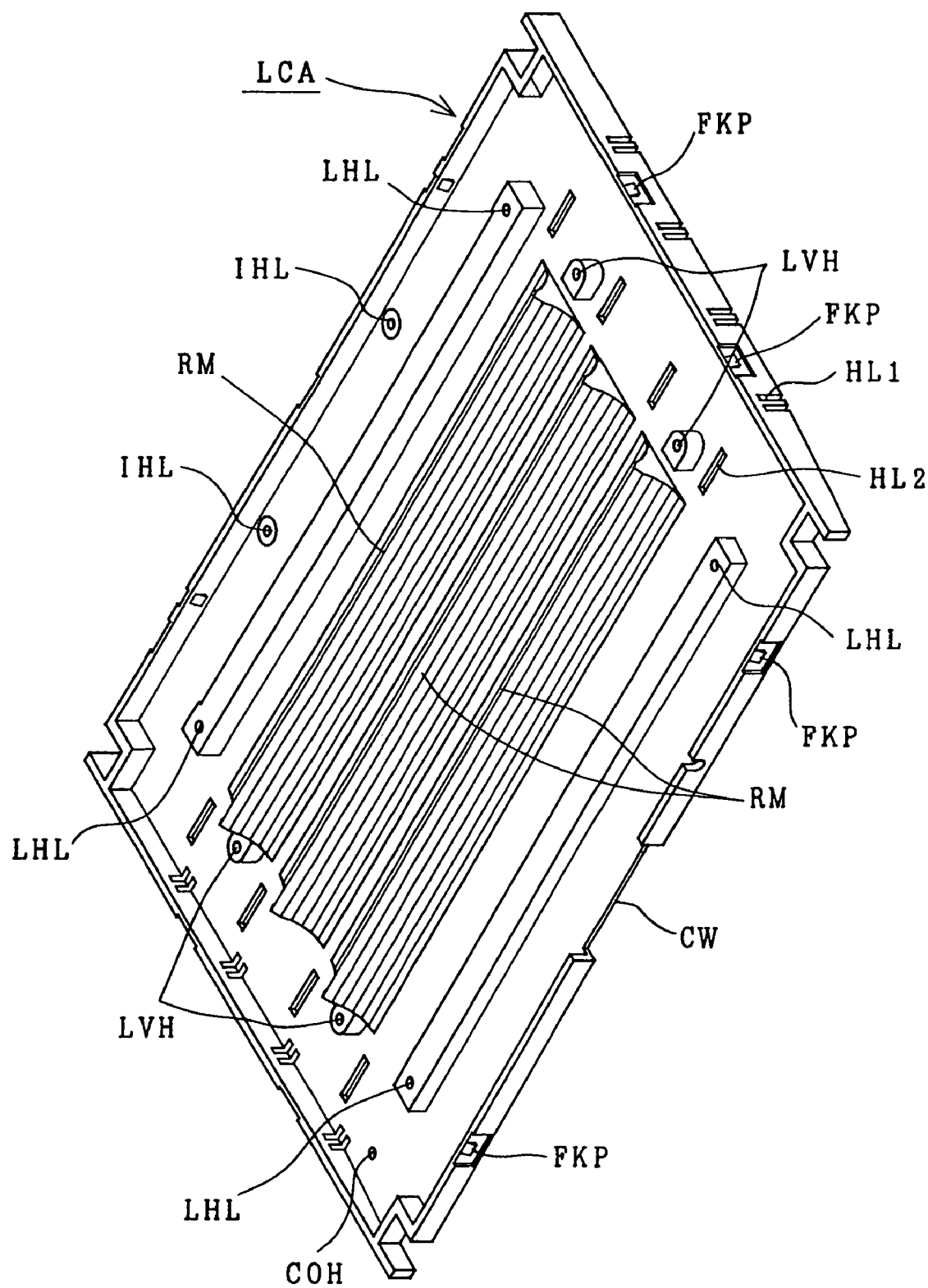
FIG. 36 is a perspective view showing the lower casing and taken from the upper side.

Letters CL designate (totally nineteen) fixing pawls for the middle frame MFR, and letters FK designate (totally nine) fixing hooks for the lower casing LCA. These pawls and hooks are integrated with the shield casing SHD. The fixing pawls CL in the shown state are individually folded inward, at the assembly, and inserted into the square fixing pawl holes CLH (as shown in the individual side views of FIG. 27) formed in the middle frame MFR. As a result, the shield casing SHD holds the middle frame MFR for holding/implementing the display panel PNL and so on so that they are firmly fixed. The fixing hooks FK are individually fitted in fixing projections FKP (as shown at the individual side views of FIG. 34), which are formed on the lower casing LCA. As a result, the shield casing SHD holds the lower casing LCA, in which the back lights BL and the back light support BLS are held and implemented, so that they are firmly fixed together. Incidentally, the middle frame MFR and the lower casing LCA are fitted at their peripheral edges, and the shield casing SHD is fitted to cover the middle frame MFR, so that these three members are integrated. Moreover, the display panel PNL is equipped on its upper and lower faces with a thin rubber spacer (or rubber cushion, although not shown) having an elongated rectangular shape on its four side edges exerting no influence upon the display. The upper side rubber spacer is sandwiched between the display panel PNL and the shield casing SHD, and the lower rubber spacer is sandwiched between the display panel PNL and the middle frame MFR and the optical diffusion plate SPB. By pushing the shield casing SHD into the device by making use of the elasticity of those rubber spacers, the fixing hooks FK are caught by the fixing projections FKP so that the two fixing members function as stoppers. Moreover, the fixing pawls CL are folded and inserted into the pawl holes CLH, and the middle frame MFR and the lower casing LCA are fixed by the shield casing SHD so that the whole module is firmly held in its entirety without any necessity for other fixing members. As a result, the assembly can be facilitated to drop the fabrication cost. Moreover, the mechanical strength can be increased to improve the resistance to vibrations and the reliability of the device. Since, moreover, the fixing pawls CL and the fixing hooks FK can be easily removed (merely by folding back the fixing pawls CL and removing the fixing hooks FK), the three members can be easily disassembled and assembled with easy repair and replacement of the back lights BL (Here, the fixing hooks FK of the lower casing LCA to be more frequently removed for the back light replacement are made more easily removable). Here, in the present module, the lower casing LCA and the middle frame MFR are fixed not only by the aforementioned fixing members but also by fastening the screws into four through screw holes LHL (as shown in FIGS. 34 to 36) formed in the lower casing LCA and four screw holes MVH (as shown in FIG. 28) of the middle frame MFR.

Letters COH designate common through holes. Two common through holes COH are commonly formed not only in the shield casing SHD but also a drive circuit substrate PCB1 of the display panel PNL, a drive circuit substrate PCB2 of the middle frame MFR, in the midddle frame MFR and in the lower casing LCA. The relative positions of the individual members and parts are precisely set by implementing them such that the individual common through holes COH are inserted at the fabrication time sequentially from the lower casing LCA onto the pins which are anchored in positions. Moreover, the common through holes COH can be used as the positioning references when the module MDL is to be packaged in an application product such as the personal computer.

In the prior art, on the other hand, there is a problem that undesirable radiation electric waves for causing the EMI (i.e., Electro Magnetic Interference) are emitted from the liquid crystal display device.

In the present invention, at least one of the divided circuit substrates is equipped with a frame ground pad, and this frame ground pad is connected with a projection which is formed integral with the metallic shield casing. As a result, the ground line in the high-frequency range can be strengthened to suppress the establishment of the undesired radiation electric waves. Specifically, as shown in FIG. 24, letters FG designate six frame grounds which are integrated with the metallic shield casing SHD. The frame grounds FG are formed of the "U-shaped" openings in the shield casing SHD, namely, elongated projections extending in the square openings. These thin projections are individually folded inward the device and are connected by solder with the frame ground pads FGP (as shown in FIG. 26), which in turn are connected with the ground lines of the drive circuit substrate PCB1 of the display panel PNL.

<<Display Panel PNL and Drive Circuit Substrate PCB1>>

Figure 26:
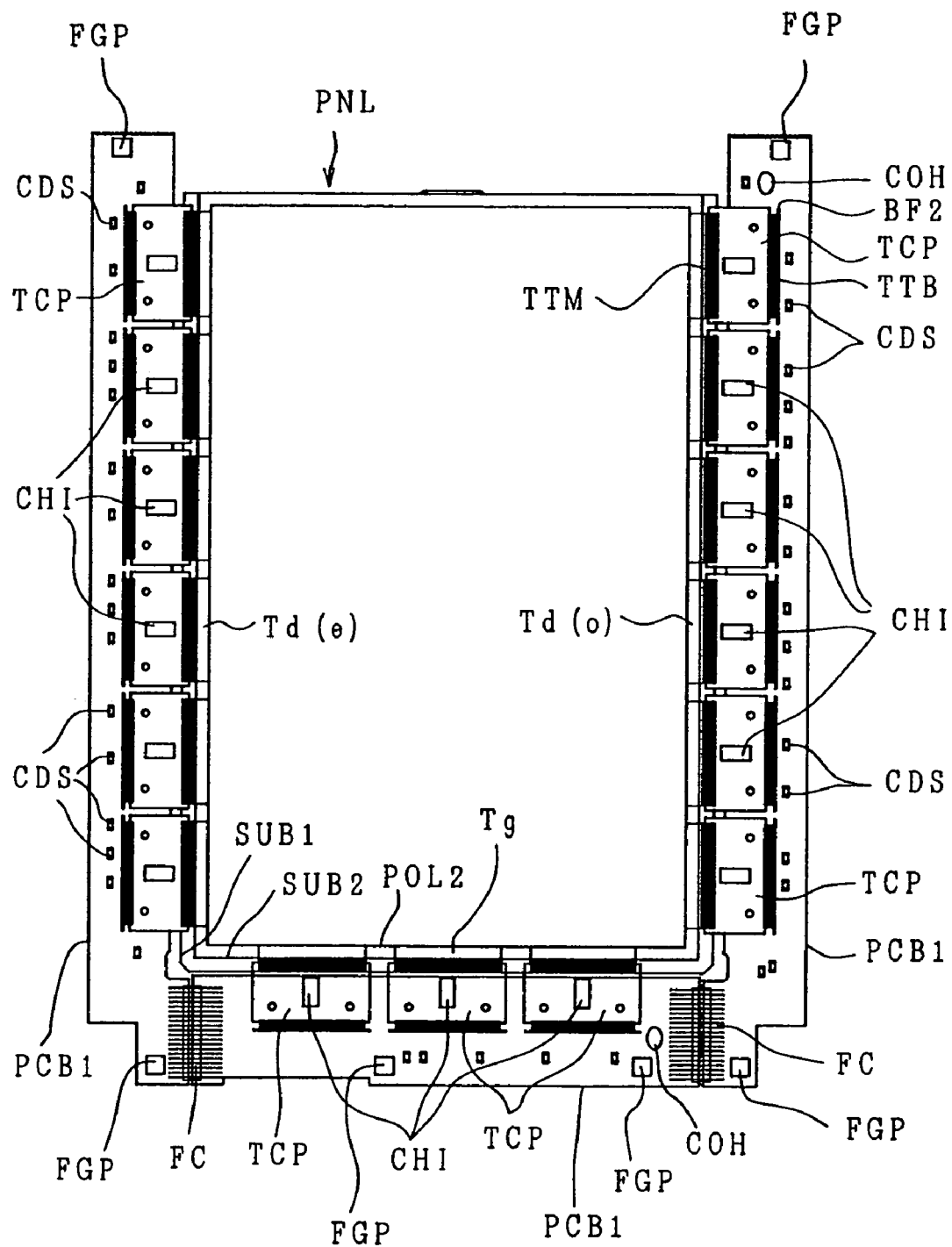
FIG. 26 is a upper side view showing the state, in which peripheral drive circuits are packaged in the liquid crystal display panel.

FIG. 26 is a top plan view showing the state in which the drive circuit is implemented in the display panel PNL shown in FIG. 16 and so on.

Letters CHI designate drive IC chips (of which: the lower three are the drive IC chips at the vertical scanning circuit side whereas the righthand and lefthand six are the drive IC chips at the video signal drive circuit side) for driving the display panel PNL. Letters TCP designate tape carrier packages in which are packaged the driving IC chips CHI by the tape automated bonding method (TAB), as has been described with reference to FIGS. 21 and 22, and letters PCB1 designate drive circuit substrates divided into three and made of PCB (i.e., Printed Circuit Boards) in which are individually implemented the tape carrier packages TCP and capacitors CDS. Letters FGP designate frame ground pads. Letters FC designate flat cables for connecting the lower side drive circuit substrate PCB1 and the lefthand side drive circuit substrate PCB1, and the lower side drive circuit substrate PCB1 and the righthand side drive circuit substrate PCB1 electrically. The flat cables FC to be used are prepared by sandwiching and supporting, as shown, a plurality of lead lines (made of phosphor bronze plated with Sn) between the striped polyethylene layer and polyvinyl alcohol layer.

<<Drive Circuit Substrate PCB1>>

The drive circuit substrate PCB1 is divided, as shown in FIG. 26, into three, which are arranged in a shape of letter "U" around the display panel PNL and individually connected electrically and mechanically through the two flat cables FC. Since the drive circuit substrate PCB1 is divided, the stress, which is established in the longitudinal direction of the drive circuit substrate PCB1 due to the difference in the coefficients of thermal expansion between the display panel PNL and the drive circuit substrate PCB1, can be absorbed at the flag cables FC to prevent any peel of the output leads (e.g., TTM of FIGS. 21 and 22) of the tape of the take carrier package TCP having a weak connection strength and the external connection terminal DTM (or GTM) of the display panel, thereby to improve the reliability of the module against the heat. According to this substrate dividing method, moreover, the single substrate material can be divided into a number of sheets of substrate PCB1 because of their simple shape so that the using efficiency of the print substrate material is better than that of the single "U-shaped" substrate. Thus, there can be achieved an effect to reduce the costs for the parts and materials (to about 50% in case of the present embodiment. Incidentally, the drive circuit substrate PCB1 can enhance the lead peel preventing effect better if it is made of a soft FPC (i.e., Flexible Printed Circuit) in place of the PCB, because the FPC is flexible. Moreover, an undivided integral "U-shaped" PCB could be used. If this case, there can be achieved an effect of enhancing the reliability by reducing the step number, by simplifying the control of the fabrication process due to the reduction of the part number, and by eliminating the connection cable between the PCBs.

The frame ground pads FGP, which are connected with each ground line of each of the three divided drive circuit substrates PCB1, are provided totally in six because they are two for each substrate, as shown in FIG. 26. In case the drive circuit substrate PCB1 is divided into plurality, no electric problem will arise if at least one of the divisions of the drive circuit substrate is connected in respect of the DC current with the frame ground. If the number of divisions is small in the high-frequency range, a potential for generating the undesired radiation electric waves for causing the EMI (i.e., Electro Magnetic Interference) will be increased by the reflection of electric signals and the deflection of the potential of the ground lines due to the difference in the characteristic impedance between the divided individual drive circuit substrates. Especially, the module MDL using the thin film transistors finds it difficult to counter-measure the EMI because it uses a high-speed clock. In order to prevent the EMI, the ground line (at the AC ground potential) is connected in at least one portion, e.g., two portions in the present embodiment for each of the plurality of divided drive circuit substrates PCB1 with a common frame (i.e., the shield casing SHD) having a sufficiently low impedance. As a result, the ground line is strengthened in the high-frequency range, an improvement of 5 dB or more in terms of the field intensity of the radiation can be observed in case of the six connected portions of the present embodiment, as compared with the case in which totally one portion is connected with the shield casing SHD.

The frame grounds FG of the shield casing SHD are made of thin metal projections so that they can be easily connected with the frame ground pads FGP of the display panel PNL by folding them, thus requiring no special wire (or lead) for the connections. Moreover, the shield casing SHD and the drive circuit substrate PCB1 can also be mechanically connected through the frame grounds FG, to improve the mechanical strength of the drive circuit substrate PCB1.

<<Middle Frame MFR>>

Figure 27:
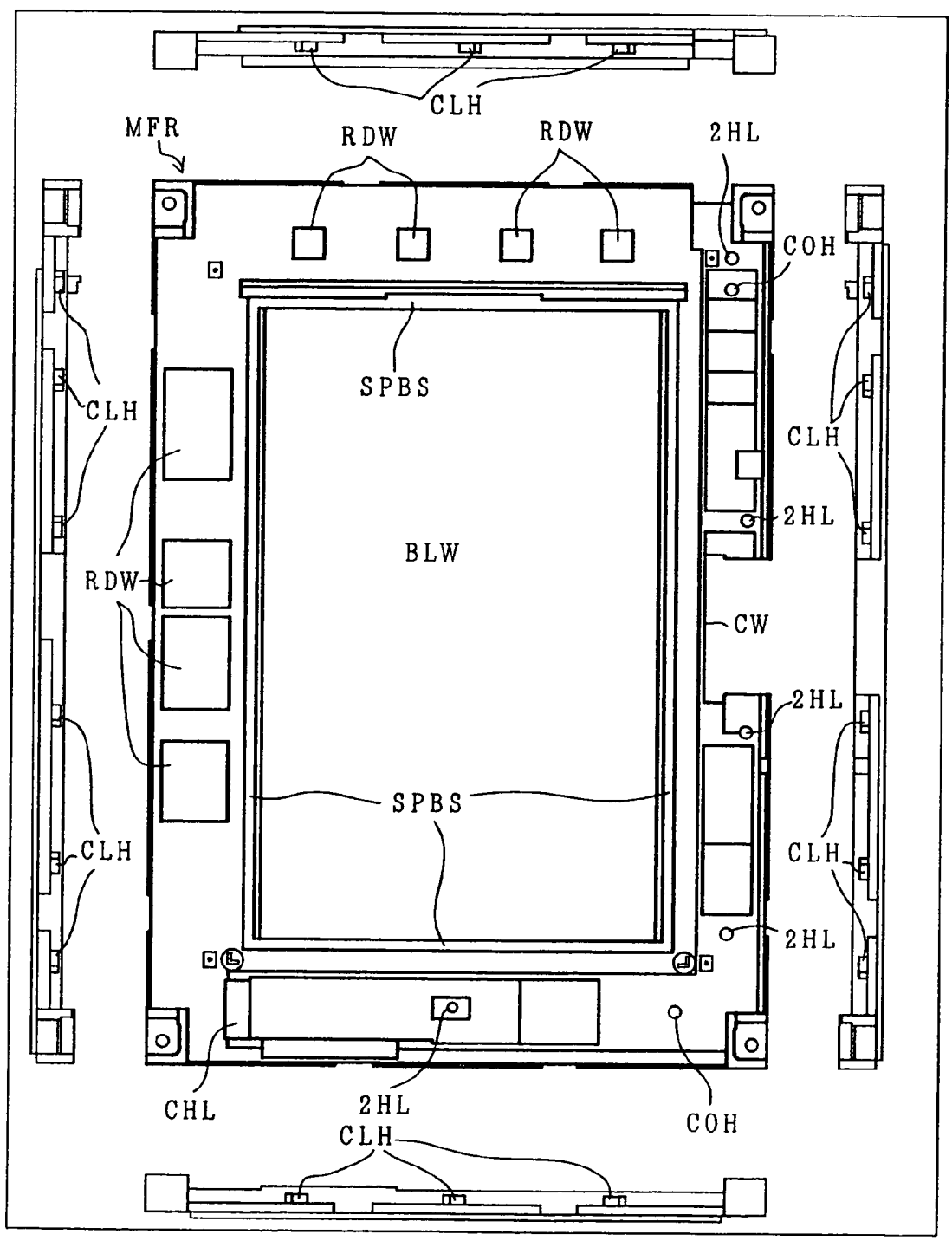
FIG. 27 presents upper side, front side, rear side, righthand side and lefthand side views of a middle frame.
Figure 28:
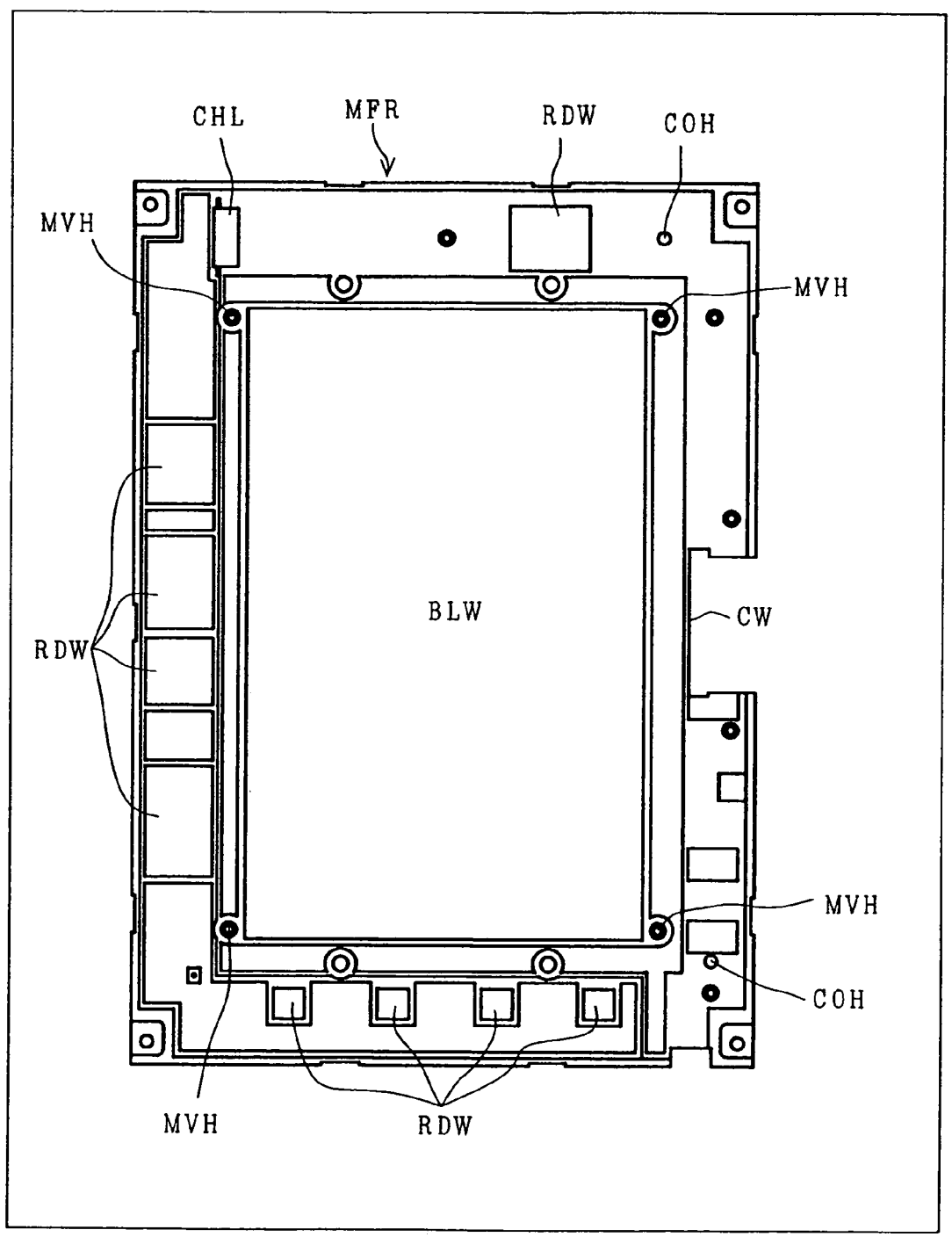
FIG. 28 is a lower side view showing the middle frame.
Figure 29:
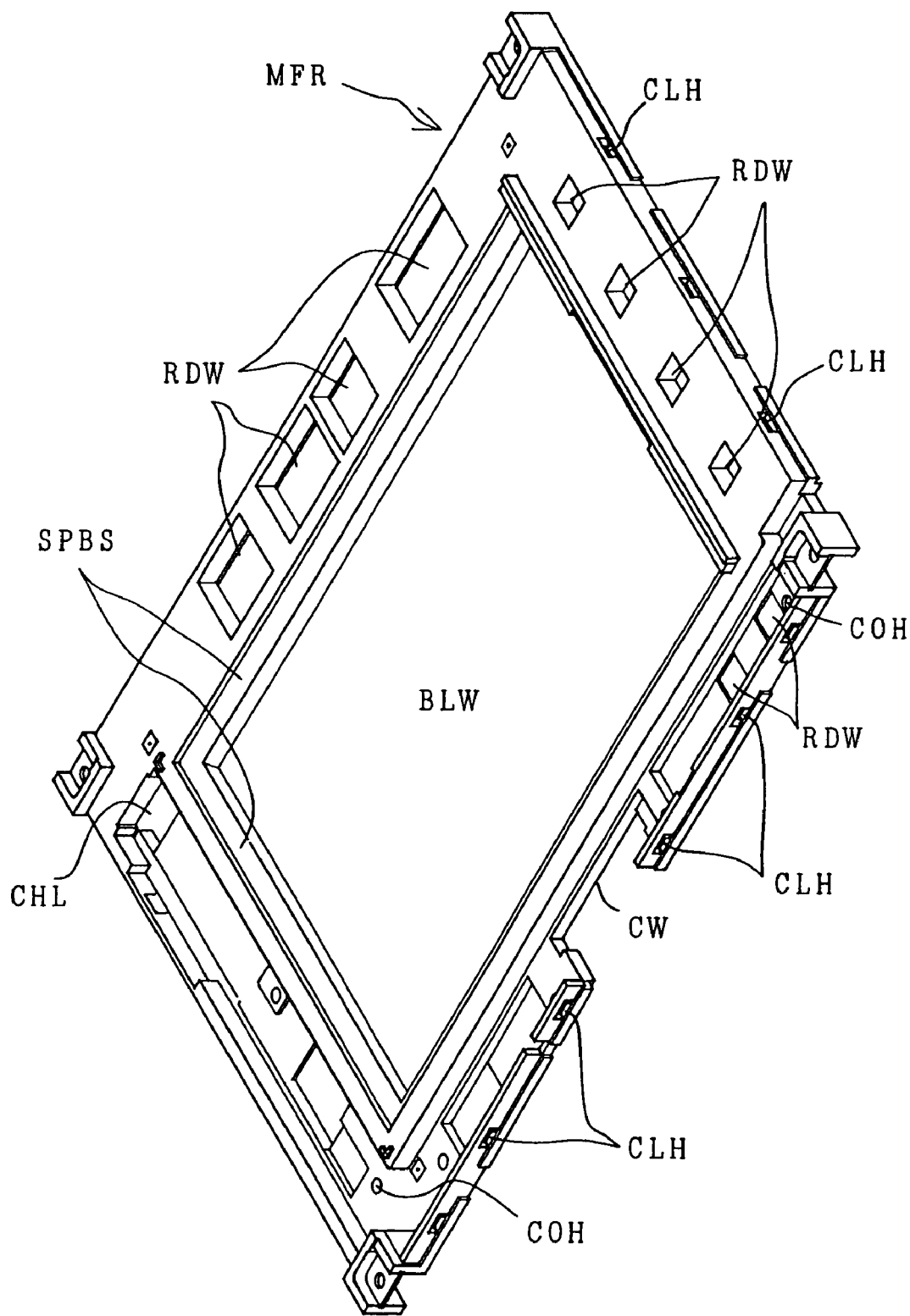
FIG. 29 is a perspective view showing the middle frame and taken from the upper side.

FIG. 27 presents the upper side, front side, rear side, righthand side and lefthand side of the middle frame MFR; FIG. 28 presents a bottom side of the middle frame; and FIG. 29 is a perspective view taken from the top side of the middle frame MFR.

The middle frame MFR is a member for holding the liquid crystal display LCD, the optical diffusion board and the L-shaped drive circuit substrate PCB2, which are integrated with the drive circuit substrate PCB1.

Figure 30:
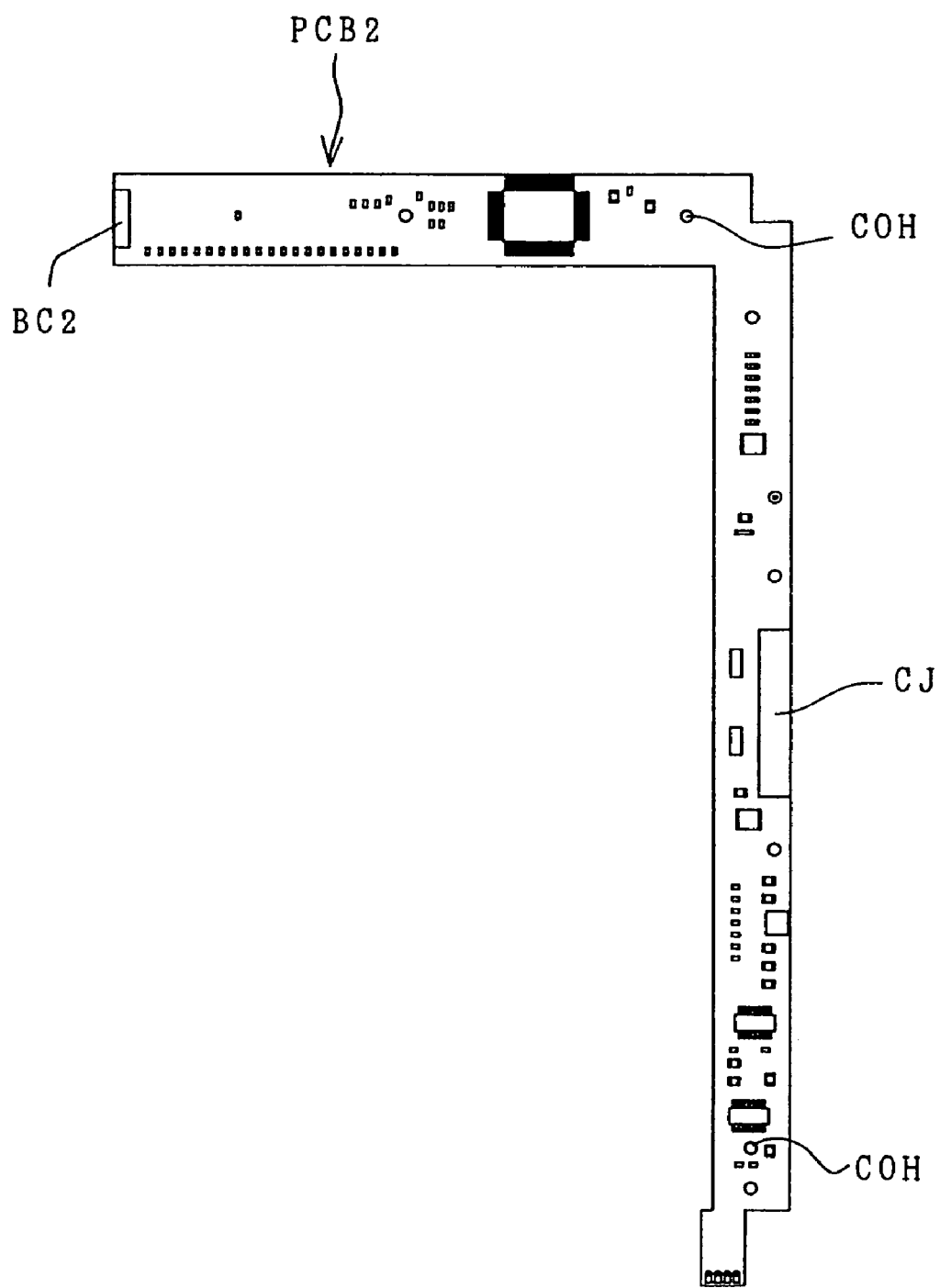
FIG. 30 is a lower side view showing a drive circuit substrate to be mounted on the middle frame.

Letters BLW designate a back light window for introducing the light of the back lights BL into the liquid crystal display LCD and for placing/holding the optical diffusion board SPB. Letters SPBS designate a portion for holding the optical diffusion board SPB. Letters RDW designate radiation holes, and letters CW designate notches for connectors to be connected with the outside. Letters MVH designate four screw holes for fixing the lower casing LCA and the middle frame MFR therethrough and through the through holes LHL (as shown in FIGS. 34 to 36) of the lower casing LCA by means of not-shown screws. Letters CLH designate fixing holes (as shown in the individual side views of FIG. 27 and in FIG. 29), into which are inserted the fixing pawls CL of the shield casing SHD. Letters 2HL designate fixing holes of the drive circuit substrate PCB2 (as shown in FIG. 30), into which are inserted fixing members such as nylon rivets. The L-shaped drive circuit substrate PCB2 is arranged in the L-shaped region of the righthand and lower edges of the top plan view of the middle frame MFR of FIG. 27. Incidentally, the middle frame MFR is made of a synthetic resin in the same white color as that of the back light support BLS and the lower casing LCA. Moreover, since the middle frame MFR is made of the synthetic resin, it is advantageous in the insulations of the drive circuit substrate PCB1 and the drive circuit substrate PCB2.

<<Optical Diffusion Plate SPB>>

The optical diffusion board SPB (as shown in FIG. 23) is held on the holding portion SPBS (which is lower than the upper face of the middle frame MFR, as shown in FIGS. 27 and 29) which is provided on the four peripheral edge portions of the back light window BLW of the middle frame MFR. If the optical diffusion board SPB is placed on the holding portion SPBS, the optical diffusion board SPB and the middle frame MFR have their upper faces located in a common plane. On the optical diffusion board SPB, there is placed the liquid crystal display LCD which is integrated with the drive circuit substrate PCB1. Between the liquid crystal display LCD and the optical diffusion board SPB, there is sandwiched the four rubber spacers (although not shown but should be referred to the column of <<Shield Casing SHD>>), which are arranged on the four peripheral edges of the lower side of the liquid crystal display LCD, to seal up the liquid crystal display LCD and the optical diffusion board SPB. Specifically, the optical diffusion board SPB is placed on the middle frame MFR (or frame) whereas the optical diffusion board SPB has its upper face covered with the liquid crystal display LCD, so that the liquid crystal display LCD and the optical diffusion board SPB have their gap sealed up completely with the rubber spacers (that is, the optical diffusion board SPB and the liquid crystal display LCD are integrated and fixed independently of the back light portion by means of the middle frame MFR). This construction can suppress the problems that a foreign substance may invade into the gap between the liquid crystal display LCD and the optical diffusion plate SPB, and that a foreign substance caught electrostatically by a portion other than the display region may move to the display region to drop the display quality. Incidentally, the optical diffusion board SPB is so thicker than the optical diffusion sheet as to prevent the foreign substance from being outstanding at the lower side of the optical diffusion board SPB. Moreover, the foreign substance present at the lower side of the optical diffusion board SPB is so far from the liquid crystal display LCD as to become reluctant to be focused. The image is diffused to raise no problem. Still moreover, the construction is excellent because the optical diffusion board SPB and the liquid crystal display LCD are sequentially held on the middle frame MFR.

<<Drive Circuit Substrate PCB2>>

Figure 31:
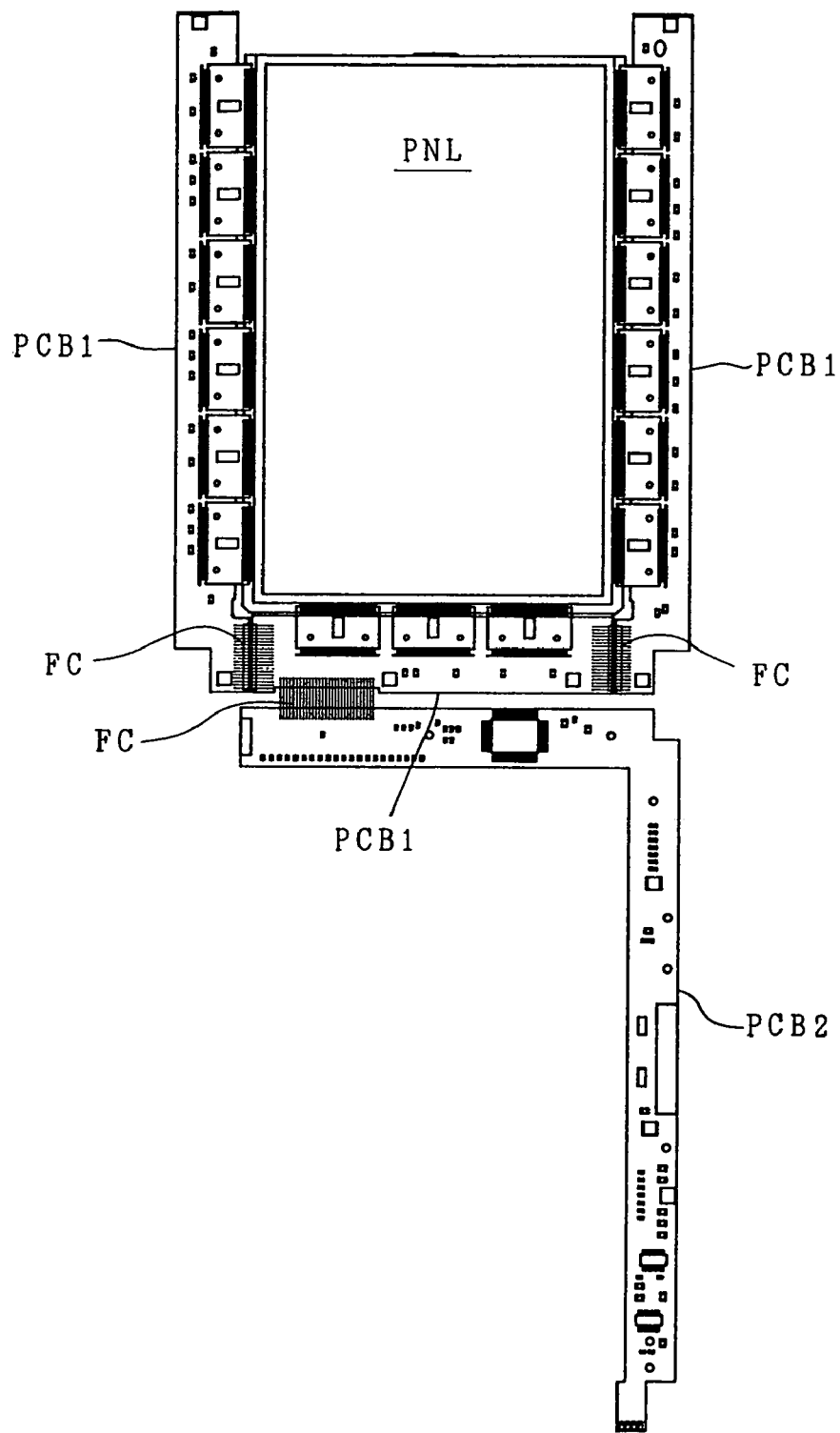
FIG. 31 is an upper side view showing the connection state between the peripheral drive circuit substrate (as viewed from the upper side) of the liquid crystal display and the drive circuit substrate (as viewed from the lower side) to be mounted on the middle frame.

FIG. 30 presents the lower side of the drive circuit substrate PCB2. The drive circuit substrate PCB2 of the liquid crystal display LCD to be held and mounted in the middle frame MFR is formed into an L-shape, as shown in FIG. 30, to implement electronic parts such as ICs, capacitors or resistors. In this drive circuit substrate PCB2, there are mounted a power supply circuit for achieving a plurality of divided stable voltage sources from one voltage source and a circuit including a circuit for converting data for CRT (i.e., Cathode Ray Tube) from a host (i.e., a higher-order operational processor) to data for the TFT liquid crystal display device. Letters CJ designate a connector connection portion to be connected with a not-shown connector to be connected with the outside. Incidentally, the drive circuit substrate PCB2 and the drive circuit substrate PCB1 are electrically connected, as shown in FIG. 31, by the flat cable FC (as will be described in detail hereinafter). Moreover, the drive circuit substrate PCB2 and the inverter circuit substrate IPCB are electrically connected through the connector holes CHL (as shown in FIGS. 27 to 29), which are formed in the middle frame MFR, by the not-shown back light connector and back light cable which are connected with the back light connection portion BC2 of the drive circuit substrate PCB2 and the back light connection portion BCI of the inverter circuit substrate IPCB.

<<Electric Connection between Drive Circuit Substrate PCB1 and Drive Circuit Substrate PCB2>>

FIG. 31 presents the upper side showing the connection state between the drive circuit substrate PCB1 (whose upper side is seen) of the liquid crystal display LCD and the drive circuit substrate PCB2 (whose lower side is seen) of the middle frame MFR.

The liquid crystal display LCD and the drive circuit substrate PCB2 are electrically connected through the foldable flat cables FC. In this state, the operation check can be accomplished. The drive circuit substrate PCB2 is arranged over the lower side of the liquid crystal display LCD by bending the flat cables FC by 180 degrees and is fitted in a predetermined recess of the middle frame MFR until it is fixed by fixtures such as nylon rivets. On the drive circuit substrate PCB2, there is placed and held the drive circuit substrate PCB1 which is integrated with the liquid crystal display LCD.

<<Back Light Support BLS>>

Figure 32:
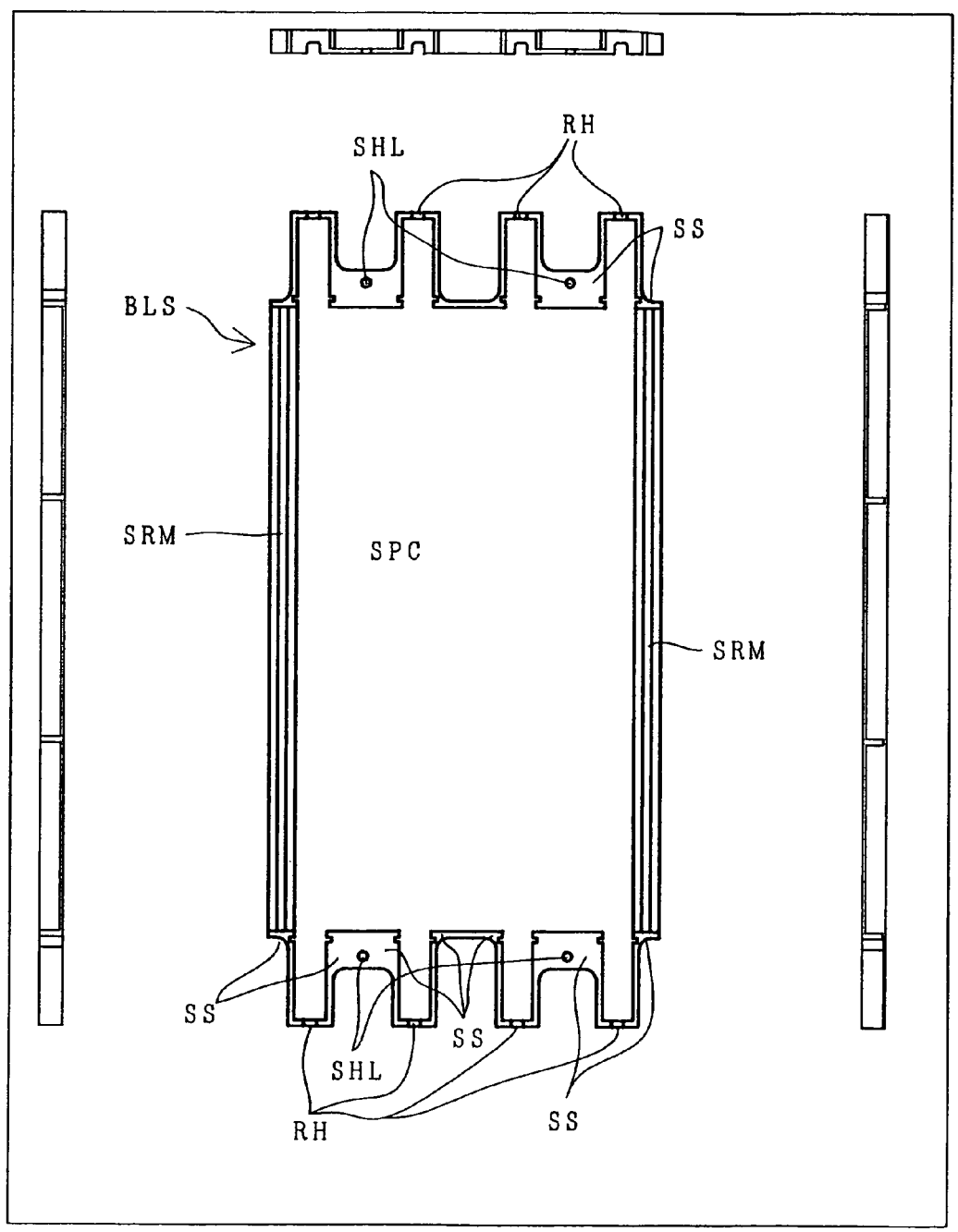
FIG. 32 presents upper side, rear side, righthand side and lefthand side views of a back light support.
Figure 33:
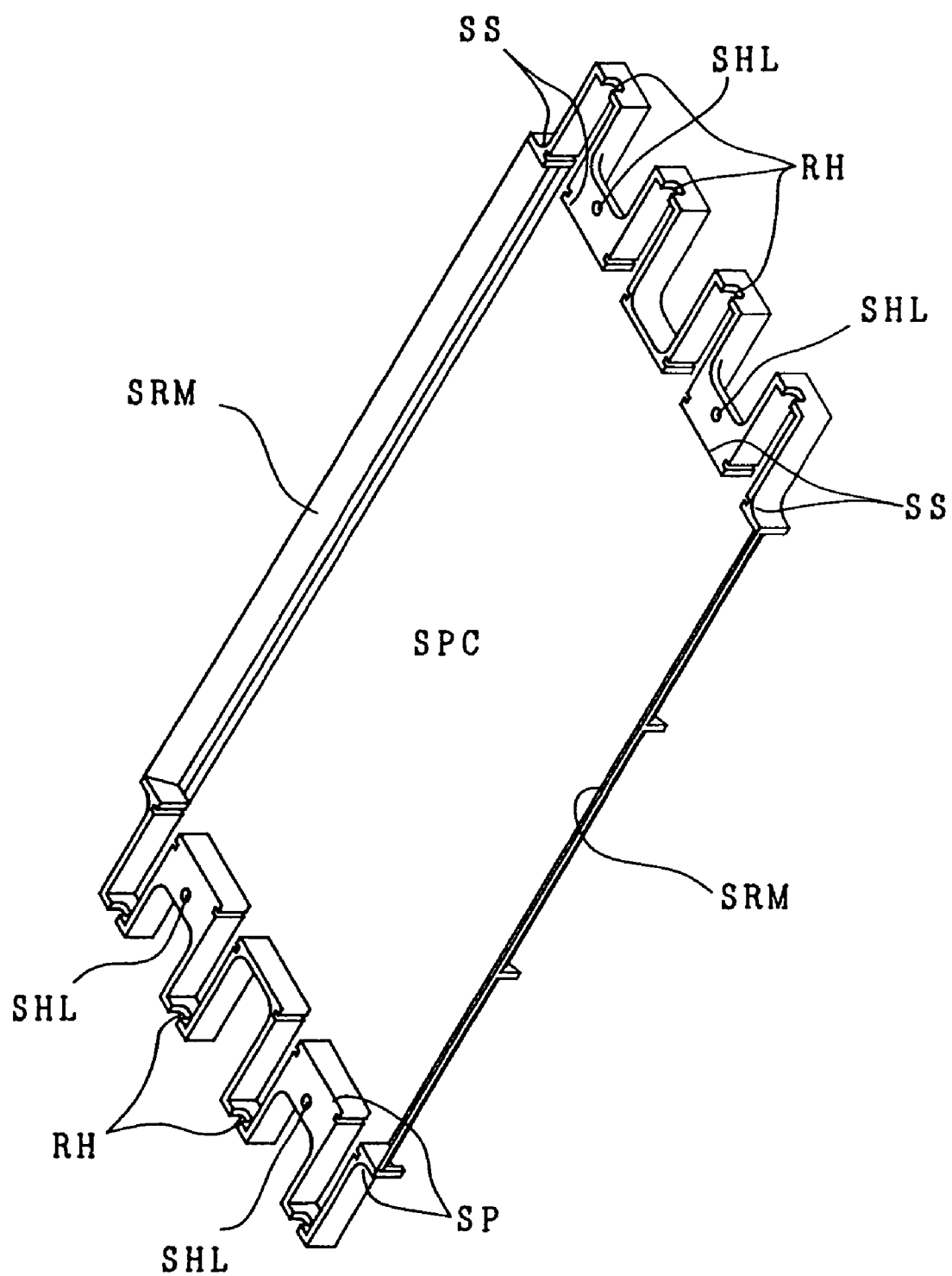
FIG. 33 is a perspective view showing the back light support and taken from the upper side.

FIG. 32 presents the upper side, rear side, righthand side and lefthand side of the back light support BLS, and FIG. 33 is a perspective view showing the back light support BLS from its upper side.

Figure 37:
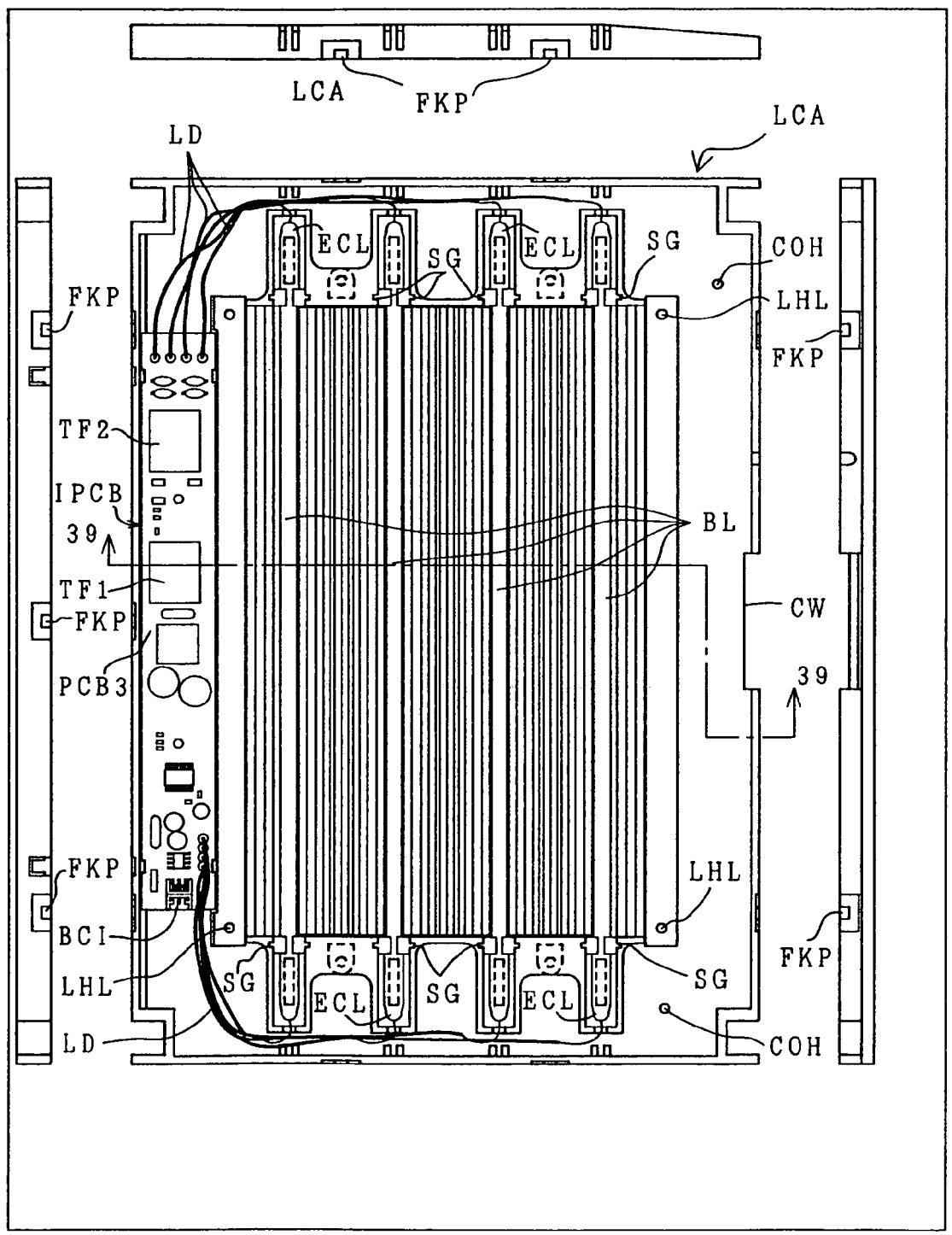
FIG. 37 presents upper side, rear side, righthand side and lefthand side views showing the state, in which the back light support, back lights and an inverter circuit substrate are mounted in the lower casing.

The back light support BLS supports the four back lights (i.e., cold-cathode fluorescent lamps) BL (as shown in FIGS. 37 and 23). Letters SPC designate a hole (or space), and the back light support BLS forms a frame.

Figure 39:
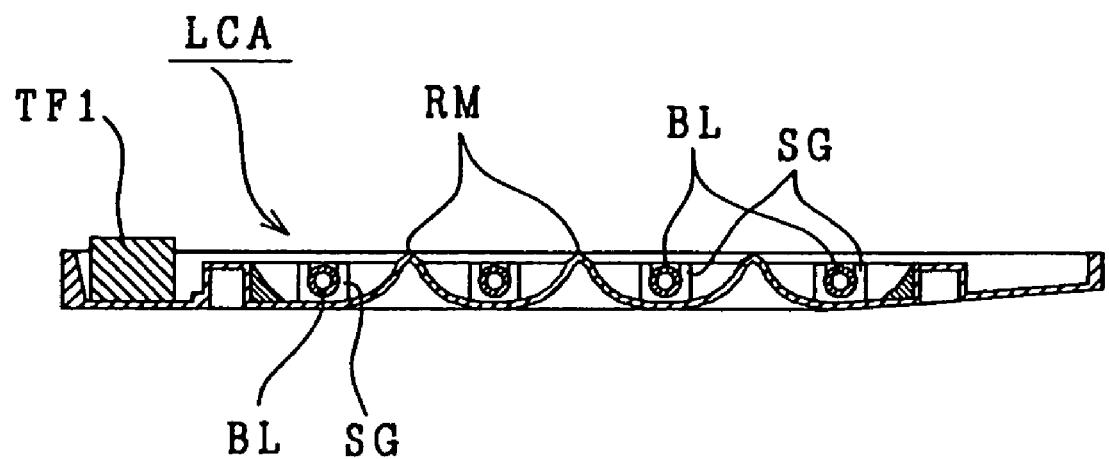
FIG. 39 is a section taken along line 39-39 of FIG. 37.

The back light support BLS supports the four back lights BL through white silicone rubbers SG (as shown in FIGS. 37 and 39). Letters SS designate a back light support for supporting the two ends of each back light BL through the silicone rubbers SG. Incidentally, the silicone rubbers SG function to prevent any foreign substance from stealing into the lighting regions of the back lights BL. Letters RH designate lead holes through which are guided leads LD (as shown in FIG. 37) connected with the two ends of the back lights BL.

Letters SHL designate four through holes formed in the back light support BLS. These through holes SHL are aligned with the screw holes LVH of the lower casing LCA and are fixed in the lower casing LCA by means of not-shown screws.

Letters SRM designate back light reflectors which are formed on the righthand and lefthand inner sides of the back light support BLS of FIG. 32 for reflecting the back lights BL (i.e., the outer two BL of the four back lights BL). Like the upper sides of the back light reflectors RM (as shown in FIGS. 34 and 36), the back light reflectors SRM are constructed of a combination of a plurality of planes for reflecting the lights of the back lights BL efficiently toward the liquid crystal display LCD (as should be referred to the description of <<Lower Casing>>). Incidentally, the back light support BLS is molded of a synthetic resin in the same white color as that of the middle frame MFR and the lower casing LCA.

According to the embodiment of the present invention, moreover, the back light support for supporting the back lights are provided separately of the casings of the back lights the leads of the back lights can be soldered to the inverter circuit substrate while being supported by the back light supports, before the back lights are fixed in its casing. Thus, the working efficiency is excellent, and the replacement of defective parts is easy.

<<Lower Casing LCA>>

Figure 38:
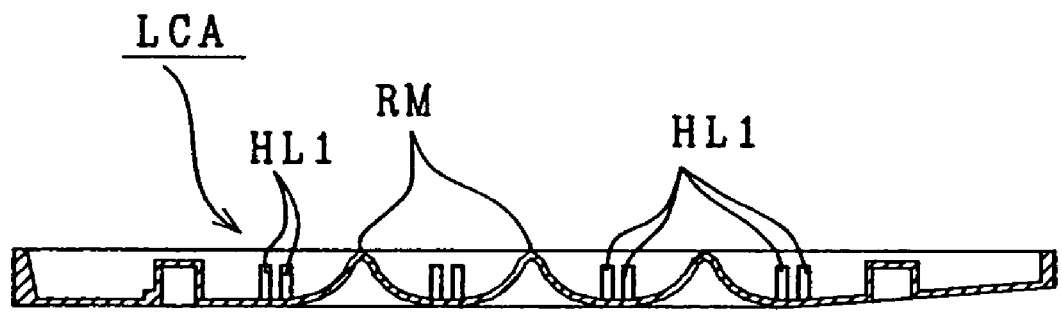
FIG. 38 is a section (as taken along line 38-38 of FIG. 34) of the lower casing.

FIG. 34 presents the upper side (or reflecting side), rear side, righthand side and lefthand side of the lower casing LCA; FIG. 35 presents the lower side of the lower casing LCA; FIG. 36 is a perspective view showing the lower casing LCA from its upper side; and FIG. 38 is a section (taken along line 38-38 of FIG. 34) showing the lower casing LCA.

The lower casing LCA is a holding member (or back light mounting casing) for the back lights BL, the back light support BLS, and an inverter circuit substrate IPCB for lighting the back lights BL. The lower casing LCA acts as the reflectors for the back lights BL and is integrally molded of a synthetic resin in white or a color capable of reflecting the lights of the back lights BL the most efficiently. The lower casing LCA is formed on its upper face with three back light reflectors RM which are made integral with the lower casing LCA to provide the reflecting faces of the back lights BL. The three back light reflectors RM are composed of a combination of a plurality of planes for reflecting the lights of the back lights BL efficiently toward the liquid crystal display LCD. Specifically, the back light reflectors RM have sections contoured by straight lines which are approximated from curves computed to reflect the lights of the back lights BL the most efficiently. Incidentally, the back light reflectors RM are higher than the upper faces of the back lights BL so as to increase the reflectivities (as shown in FIG. 39). Since the casing for and the reflectors of the back lights BL are thus constructed of the integral member, the number of parts can be reduced to simplify the structure and to drop the fabrication cost. Thus, it is possible to improve the vibrational shock resistance and thermal shock resistance of the device and to improve the reliability of the device. Since the lower casing LCA is made of a synthetic resin, it is advantageous in the insulation of the inverter circuit substrate IPCB.

Incidentally, letters LVH designate four screw holes, and the back light support BLS is fixed in the lower casing LCA through those screw holes LVH and the through holes SHL (as shown in FIGS. 32 and 33) of the back light support BLS by means of the not-shown screws. Letters LHL designate four through holes, and the middle frame MFR and the lower casing LCA are fixed through those through holes LHL and the screw holes MVH (as shown in FIG. 28) of the middle frame MFR by means of the not-shown screws. Letters IHL designate fixing holes, into which are inserted fixing members such as nylon rivets for fixing the inverter circuit substrate IPCB; letters CW designate notches for the connectors to be connected with the outside; and letters FKP designate fixing projections (as shown at the individual sides of FIG. 34 and in FIG. 36), in which are fitted fixing hooks FK of the shield casing SHD.

<<Back Lights BL>>

FIG. 37 presents the upper side, rear side, righthand side and lefthand side showing the state in which the back light support BLS, the back lights BL and the inverter circuit substrate IPCB are mounted in the lower casing LCA, and FIG. 39 is a section taken along line 39-39 of FIG. 37.

The back lights BL are of the below lights type, in which it is arranged just below the liquid crystal display LCD. The back lights BL are constructed of four cold-cathode fluorescent lamps and is supported by the back light support BLS. The back lights BL are held in the lower casing LCA or the back light mounting casing by fixing the back light support BLS in the lower casing LCA through the through holes SHL of the back light support BLS and the screw holes LVH of the lower casing LCA by means of the not-shown screws.

Letters ECL designate the sealed side of the cold-cathode tube (at which a fluorescent substance is applied to the inner surface of the tube, or the tube is evacuated or filled with the gas). As shown in FIG. 37, the four juxtaposed back lights BL are arranged such that their sealed sides ECL are horizontally staggered (or vertically staggered as in FIG. 37). As a result, the transverse gradations of the color temperatures (which are higher at the sealed sides) on the display frame, which are caused as a result of applying the fluorescent substance to the fluorescent lamps, can be made less outstanding to improve the display quality.

<<Inverter Circuit Substrate IPCB>>

The inverter circuit IPCB is a circuit substrate for lighting the four back lights BL is placed in the lower casing LCA, as shown in FIG. 37, and fixed through the fixing holes IHL (as shown in FIGS. 34 to 36) of the lower casing LCA by means of the not-shown fixing members such as nylon rivets. On the inverter circuit IPCB, there are mounted two transformers TF1 and TF2 and electronic parts such as capacitors, coils or resistors. Incidentally, the inverter circuit substrate IPCB acting as a heat source is arranged in the upper portion (as shown at the lefthand side of the upper side of FIG. 37) of the device so that it has an excellent heat dissipation. Moreover, the inverter circuit substrate IPCB is arranged in the upper side of the device, whereas the L-shaped drive circuit substrate PCB2 is arranged in the lower and lefthand side (i.e., in the L-shaped region of the righthand and lower edges of the middle frame MFR, as viewed in FIG. 27) of the device. Thus, the inverter circuit substrate IPCB and the drive circuit substrate PCB2 acting as the heat sources are so arranged as not to overlap each other in view of the heat dissipation and the small thickness of the total thickness of the module.

<<Back Lights BL, Back Light Support BLS and Inverter Circuit Substrate IPCB>>

After the four back lights BL each having leads LD (as shown in FIG. 37) at its two ends have been fitted in the back light support BLS, (before the back light support BLS and the inverter circuit substrate IPCB are mounted and fixed in the lower casing LCA), the leads LD of each back light BL are soldered to the inverter circuit substrate IPCB. As a result, the back lights BL, the back light support BLS and the inverter circuit substrate IPCB constitute together one unit (as shown in FIGS. 23 and 37). In this state, the lighting tests of the back lights BL can be accomplished. In the prior art, the leads of the back lights are soldered to the inverter circuit substrate after the back lights and the inverter circuit substrate have been individually fixed in the back light mounting casing. The space for the soldering operation is so limited that its working efficiency is insufficient. In the present module, the leads LD of the back lights BL can be soldered to the inverter circuit substrate IPCB with the back lights BL being supported by the back light support BLS, before the back lights BL and the inverter circuit substrate IPCB are fixed in the lower casing LCA. Thus, the working efficiency is excellent. Moreover, defective parts, if any, can be easily replaced by new ones. After the lighting tests have been ended, the inverter circuit substrate IPCB is fitted through the fixing holes IHL of the lower casing LCA by using the fixing members such as nylon rivets, as shown in FIG. 37, and the back light support BLS is fixed in the lower casing LCA through the four through holes SHL and screw holes LVH (as shown in FIGS. 36 and 34) by means of the not-shown screws.

In the prior art, moreover, the construction is made to use six cold-cathode tubes and two inverter circuit substrates to light three cold-cathode tubes for each inverter circuit substrate (having two transformers), and the two inverter circuit substrates are arranged at both the upper and lower sides (or at the righthand and lefthand sides of the upper side of the lower casing LCA, as viewed in FIG. 37) of the back lights in the back light casing. As a result, the total size of the back light portion is enlarged. Since the two inverter circuit substrates acting as heat sources are arranged vertically at the two sides, a problem arises in the heat dissipation. In the present device, however, the use of a single inverter circuit substrate IPCB can reduce the total size of the back light portion and can provide an excellent heat dissipation. In the present device, moreover, the inverter circuit substrate IPCB is arranged in the upper side (as shown at the lefthand side of the upper side of FIG. 37) of the device, an excellent heat dissipation can be achieved.

As has been described hereinbefore, according to the embodiments of the present invention, the fixing pawls and fixing hooks of the shield casing can be easily removed, and the shield casing, the middle frame for holding the liquid crystal display and the lower casing for mounting the back lights can be easily disassembled and assembled so that the repair and the replacement of the back lights can be easily accomplished.

The invention claimed is:

1. A liquid crystal display device comprising:
   first and second substrates with a liquid crystal layer therebetween;
   a transparent conductor formed at a liquid crystal layer side of at least one of the first and the second substrates;
   wherein at least a projected portion formed of a conductive material is formed on the transparent conductor in a pixel region, and the conductive material of the projected portion is different from that of the transparent conductor; and
   wherein a width of the projected portion at one direction is wider than a width of another direction which is formed at a right angle to the one direction.

2. A liquid crystal display device according to claim 1, wherein a thickness of the projected portion is thicker than that of the transparent conductor.

3. A liquid crystal display device according to claim 2, wherein a thin film transistor is formed on the first substrate, and the transparent conductor being formed on the first substrate.

4. A liquid crystal display device according to claim 3, wherein light shielding region is formed at the second substrate and arranged in each pixel, and at least a part of the projected portion is arranged outside of the light shielding region in the pixel in plane view.

5. A liquid crystal display device according to claim 4, wherein the projected portion is separated from a neighboring projected portion in plane view.

6. A liquid crystal display device according to claim 4, wherein the projected portion is formed from a light transparent area to a non light transparent area continuously in plane view.

7. A liquid crystal display device comprising:
   first and second substrates with a liquid crystal layer therebetween;
   a transparent conductor formed at a liquid crystal layer side of at least one of the first and the second substrates;
   wherein at least a projected portion formed of a conductive material is formed on the transparent conductor in a pixel region, and the conductive material of the projected portion is different from that of the transparent conductor;
   wherein a thickness of the projected portion is thicker than that of the transparent conductor;
   wherein a thin film transistor is formed on the first substrate, and the transparent conductor being formed on the first substrate;
   wherein light shielding region is formed at the second substrate and arranged in each pixel, and at least a part of the projected portion is arranged outside of the light shielding region in the pixel in plane view; and
   wherein a width of the projected portion at one direction is wider than a width of another direction which is formed at a right angle to the one direction.

8. A liquid crystal display device comprising:
   first and second substrates with a liquid crystal layer therebetween;
   a transparent conductor formed at a liquid crystal layer side of at least one of the first and the second substrates;
   wherein at least a projected portion formed of a conductive material is formed on the transparent conductor in a pixel region, and the conductive material of the projected portion is different from that of the transparent conductor;
   wherein a thickness of the projected portion is thicker than that of the transparent conductor;
   wherein a thin film transistor is formed on the first substrate, and the transparent conductor being formed on the first substrate;
   wherein light shielding region is formed at the second substrate and arranged in each pixel, and at least a part of the projected portion is arranged outside of the light shielding region in the pixel in plane view;
   wherein the projected portion is formed from a light transparent area to a non light transparent area continuously in plane view; and
   wherein a width of the projected portion at one direction is wider than a width of another direction which is formed at a right angle to the one direction.

9. A liquid crystal display device according to claim 4, wherein a second transparent conductor is formed on the second substrate, and the second transparent conductor is formed at both a region where the projected portion is arranged and a region where the projected portion is not arranged continuously.

10. A liquid crystal display device according to claim 3, wherein the transparent conductor is a pixel electrode and a counter electrode is formed on the second substrate.

* * * * *